(12) United States Patent
Huh et al.

(10) Patent No.: US 9,153,795 B2
(45) Date of Patent: Oct. 6, 2015

(54) DISPLAY APPARATUS MANUFACTURING METHOD

(71) Applicant: SAMSUNG DISPLAY CO., LTD., Yongin, Gyeonggi-Do (KR)

(72) Inventors: Myung-Soo Huh, Yongin (KR); Tae-Seung Yoon, Yongin (KR); Jeong-Ho Yi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/298,795

(22) Filed: Jun. 6, 2014

(65) Prior Publication Data

US 2015/0064825 A1 Mar. 5, 2015

(30) Foreign Application Priority Data

Aug. 27, 2013 (KR) ........................ 10-2013-0102002

(51) Int. Cl.
*H01L 21/00* (2006.01)
*H01L 51/56* (2006.01)
*H01L 51/00* (2006.01)

(52) U.S. Cl.
CPC .............. *H01L 51/56* (2013.01); *H01L 51/001* (2013.01)

(58) Field of Classification Search
None
See application file for complete search history.

(56) References Cited

U.S. PATENT DOCUMENTS

| | | | | |
|---|---|---|---|---|
| 5,663,077 A * | 9/1997 | Adachi et al. | ............... | 438/151 |
| 6,786,789 B2 * | 9/2004 | Sakai et al. | ............... | 445/25 |
| 7,837,838 B2 * | 11/2010 | Chua et al. | ............... | 204/192.22 |
| 2003/0201442 A1 * | 10/2003 | Makita | ............... | 257/66 |
| 2003/0203210 A1 | 10/2003 | Graff et al. | | |
| 2004/0242111 A1 * | 12/2004 | Morii | ............... | 445/24 |
| 2006/0216951 A1 | 9/2006 | Moro et al. | | |
| 2007/0138001 A1 | 6/2007 | Ko et al. | | |
| 2008/0268618 A1 * | 10/2008 | Yamazaki | ............... | 438/458 |
| 2008/0315188 A1 * | 12/2008 | Hwang et al. | ............... | 257/40 |
| 2011/0253037 A1 | 10/2011 | Tsunekawa et al. | | |
| 2013/0075739 A1 * | 3/2013 | Loy et al. | ............... | 257/60 |
| 2015/0064825 A1 * | 3/2015 | Huh et al. | ............... | 438/34 |

FOREIGN PATENT DOCUMENTS

| | | |
|---|---|---|
| JP | 2008-202491 A | 9/2008 |
| JP | 2013-044044 A | 3/2013 |
| KR | 10-2011-0074598 A | 6/2011 |

* cited by examiner

*Primary Examiner* — Charles Garber
*Assistant Examiner* — Evren Seven
(74) *Attorney, Agent, or Firm* — Christie, Parker & Hale, LLP

(57) ABSTRACT

A thin film encapsulation manufacturing apparatus includes a first cluster configured to form a first inorganic layer on a first substrate, on which an emission unit is formed, by a sputtering process; a second cluster configured to form a first organic layer on the first inorganic layer on the first substrate conveyed from the first cluster by an organic deposition process; a first connection module configured to connect the first cluster and the second cluster, configured to convey the first substrate on which the first inorganic layer is formed from the first cluster to the second cluster, and configured to cool the first substrate in a non-contact manner; and a third cluster configured to form a second inorganic layer on the first organic layer on the first substrate conveyed from the second cluster by a chemical vapor deposition (CVD) process or a plasma enhanced chemical vapor deposition (PECVD) process.

18 Claims, 6 Drawing Sheets

DISPLAY APPARATUS MANUFACTURING METHOD

CROSS-REFERENCE TO RELATED APPLICATIONS

This application claims priority to and the benefit of Korean Patent Application No. 10-2013-0102002, filed on Aug. 27, 2013 in the Korean Intellectual Property Office, the disclosure of which is incorporated herein in its entirety by reference.

BACKGROUND

1. Field

One or more embodiments of the present invention relate to a display device manufacturing method using a thin film encapsulation manufacturing device.

2. Description of the Related Art

Recently, mobile electronic devices have become widely used. In addition to compact electronic devices such as mobile phones, tablet personal computers (PCs) have also recently become widely used as mobile electronic devices. In order to provide various functions, the mobile electronic devices include a display apparatus to provide visual information, such as images, to users. Recently, because components for driving a display device have become compact, a proportion of the display device that occupies electronic devices is gradually increasing. A display device which is bendable up to an angle (e.g., up to a predetermined angle) from a planar state has also been developed.

In particular, a light emitting unit of a flexible display device may be encapsulated using multiple thin films to increase the lifetime or lifespan of the display device. In this case, research into encapsulation thin films formed during the encapsulation is currently being conducted.

SUMMARY

Aspects of one or more embodiments of the present invention are directed toward a display apparatus manufacturing method using a thin film encapsulation manufacturing apparatus capable of adjusting thicknesses of organic layers and inorganic layers and maintaining (e.g., uniformly maintaining) vacuum degrees of various thin film equipment.

Additional aspects and features will be set forth in part in the description which follows and, in part, will be apparent from the description, or may be learned by practice of the presented embodiments.

According to one or more embodiments of the present invention, a method of manufacturing a display apparatus includes forming a first inorganic layer on a first substrate, on which an emission unit is formed, by using a sputtering process; cooling the first substrate on which the first inorganic layer is formed by absorbing radiation emitted therefrom in a non-contact manner; forming a first organic layer on the first inorganic layer by an organic deposition process; and forming a second inorganic layer on the first organic layer.

The second inorganic layer may be formed after flipping the first substrate.

The method may also include cooling the first substrate on which the first organic layer is formed in the non-contact manner.

The first inorganic layer, the first organic layer, and the second inorganic layer may be respectively formed in a plurality of first process chambers of a first cluster, a plurality of second process chambers of a second cluster, and a plurality of third process chambers of a third cluster.

A sequence of the plurality of first process chambers of the first cluster, the plurality of second process chambers of the second cluster, and the plurality of third process chambers of the third cluster may be determined, and the first inorganic layer, the first organic layer, and the second inorganic layer may be respectively formed in a first one of the plurality of first process chambers of the first cluster, a first one of the plurality of second process chambers of the second cluster, and a first one of the plurality of third process chambers of the third cluster according to the determined sequence.

The first cluster and the second cluster may be coupled by a first connection module that is configured to convey the first substrate from the first cluster to the second cluster, and when the first substrate is conveyed, internal pressures of the first cluster and the first connection module or of the first connection module and the second cluster may be substantially the same.

The second cluster and the third cluster may be coupled by a second connection module that is configured to convey the first substrate from the second cluster to the third cluster, and when the first substrate is conveyed, internal pressures of the second cluster and the second connection module or of the second connection module and the third cluster may be substantially the same.

The cooling of the first substrate, the forming of the first organic layer, and the forming of the second inorganic layer may be performed sequentially so that the first organic layer and the second inorganic layer are alternately stacked on the first inorganic layer.

The first inorganic layer and the first organic layer may be formed by downward deposition, and the second inorganic layer may be formed by upward deposition.

Before the forming of the first inorganic layer, the first substrate with the first inorganic layer formed thereon may be received from the outside via a loading cluster.

The first substrate may be cooled by a second substrate cooling unit that is spaced from the first substrate, and the second substrate cooling unit may includes a second cooling plate spaced from the first substrate; and a second cooler coupled to and cooling the second cooling plate.

A second refrigerant passage, through which a second refrigerant circulated by the second cooler flows, may be formed in the second cooling plate.

The method may further include cooling the first substrate on which the first organic layer is formed in the non-contact manner.

The second inorganic layer may be formed by a chemical vapor deposition (CVD) process or a plasma enhanced chemical vapor deposition (PECVD) process.

The method may further include cooling the first substrate before forming the first inorganic layer.

The first connection module may include a second substrate cooling unit cooling the first substrate in a non-contact manner, and the first substrate may be cooled as it is conveyed from the first cluster to the second cluster.

Prior to forming each of the first inorganic layer, the first organic layer, and the second inorganic layer, a mask may be moved from each of a first mask stock chamber, a second mask stock chamber, and a third mask stock chamber into one of the plurality of the first process chambers of the first cluster, one of the plurality of the second process chambers of the second cluster, and one of the plurality of the third process chambers of the third cluster, respectively, and the first substrate may be moved to be between a substrate holder and the mask in each of the one first process chamber, the one second process chamber, and the one third process chamber, and the first inorganic layer, the first organic layer, and the second inorganic layer may be formed on the first substrate in the one first process chamber, the one second process chamber, and the one third process chamber, respectively.

The first substrate may be aligned by an aligning instrument, the aligning instrument may include a mark on the first substrate; an open space in the mask; and a vision unit, and aligning the first substrate may include adjusting the first substrate or the mask until the mark on the first substrate is visible through the open space on the mask.

BRIEF DESCRIPTION OF THE DRAWINGS

These and/or other aspects and features will become apparent and more readily appreciated from the following description of the embodiments, taken in conjunction with the accompanying drawings of which.

DETAILED DESCRIPTION

Figure 1:
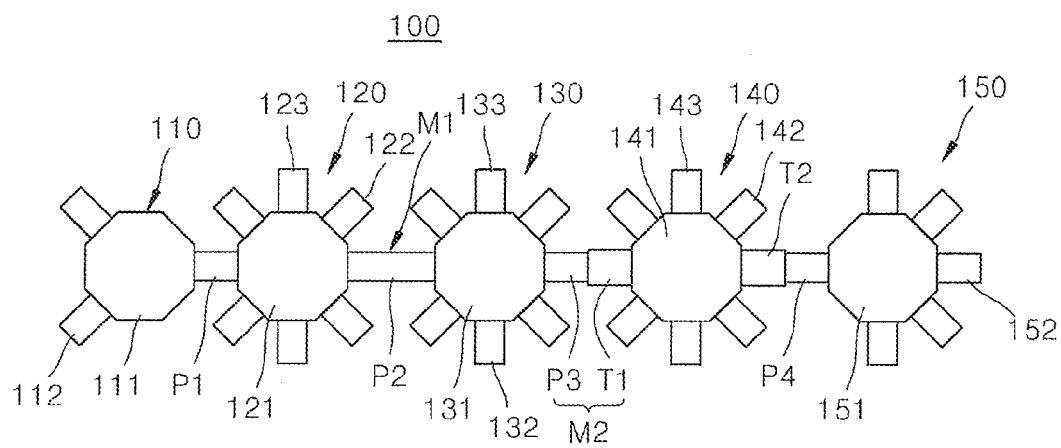
FIG. 1 is a conceptual diagram of a thin film encapsulation manufacturing apparatus according to an embodiment of the present invention.

Reference will now be made in detail to example embodiments, examples of which are illustrated in the accompanying drawings, wherein like reference numerals refer to like elements throughout. In this case, the present embodiments may have different forms and should not be construed as being limited to the descriptions set forth herein. Accordingly, the embodiments are merely described below, by referring to the figures, to explain aspects of the present invention. The terminology used herein is for the purpose of describing particular example embodiments only and is not intended to be limiting of the inventive concept. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof. It will be understood that, although the terms "first", "second", "third", etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Figure 2:
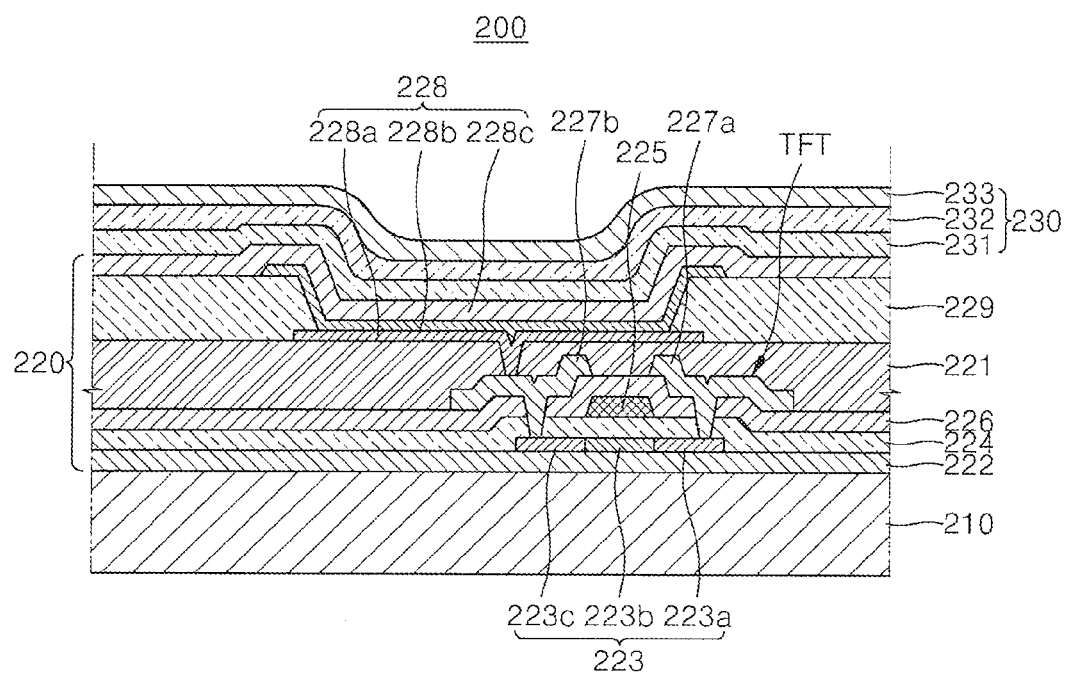
FIG. 2 is a cross-sectional view of a display apparatus manufactured using the thin film encapsulation manufacturing apparatus shown in FIG. 1.
Figure 3:
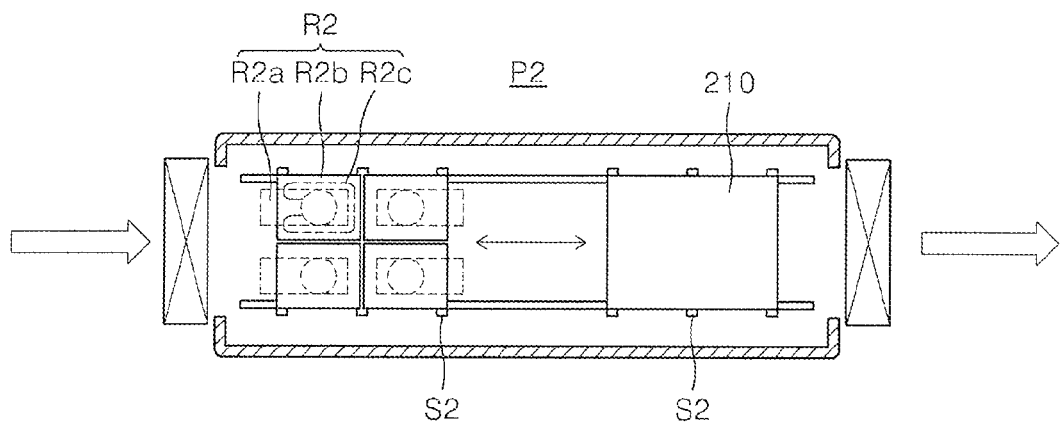
FIG. 3 is a plan view of a second conveyance chamber shown in FIG. 1.
Figure 4:
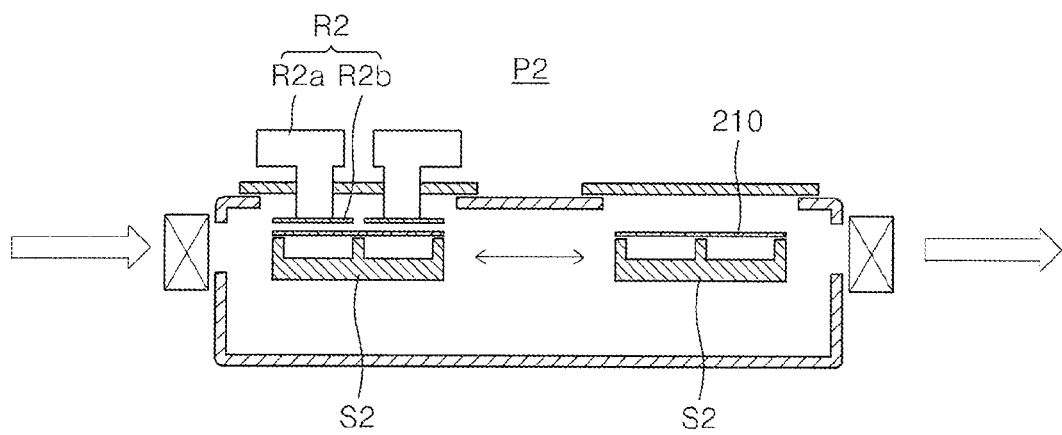
FIG. 4 is a cross-sectional view of the second conveyance chamber shown in FIG. 1.
Figure 5:
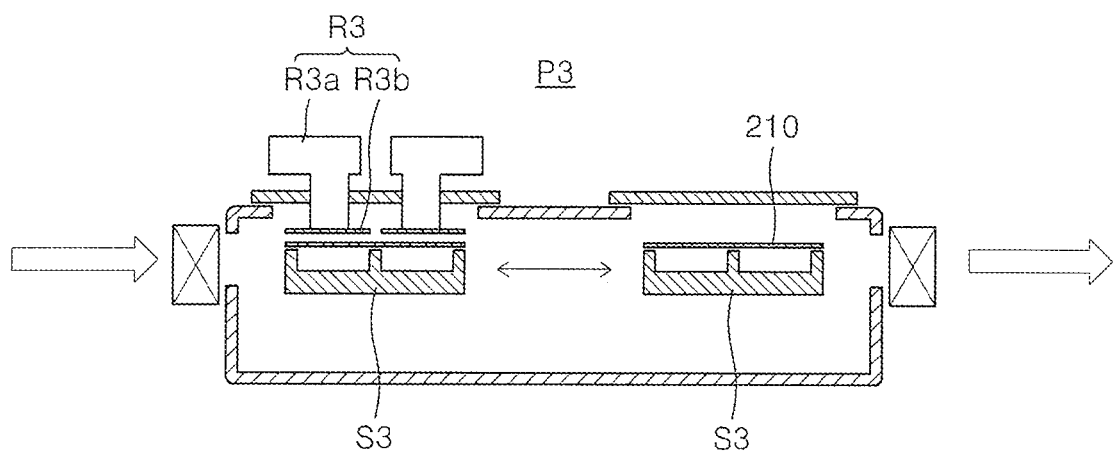
FIG. 5 is a cross-sectional view of a third conveyance chamber shown in FIG. 1.

FIG. 1 is a conceptual diagram of a thin film encapsulation manufacturing apparatus 100 according to an embodiment of the present invention. FIG. 2 is a cross-sectional view of a display apparatus 200 manufactured using the thin film encapsulation manufacturing apparatus 100 shown in FIG. 1. FIG. 3 is a plan view of a second conveyance chamber P2 shown in FIG. 1. FIG. 4 is a cross-sectional view of the second conveyance chamber P2 shown in FIG. 1. FIG. 5 is a cross-sectional view of a third conveyance chamber P3 shown in FIG. 1.

Referring to FIGS. 1 through 5, the thin film encapsulation manufacturing apparatus 100 may include a loading cluster 110, a first conveyance chamber P1, a first cluster 120, a first connection module M1, a second cluster 130, a second connection module M2, a first turn module chamber T1, a third cluster 140, a second turn module chamber T2, a fourth conveyance chamber P4, and an unloading cluster 150.

The loading cluster 110 may receive a first substrate 210 on which a light-emitting unit 220 is formed from the outside and supply the first substrate 210 on which the light-emitting unit 220 is formed to the first cluster 120. For example, the first substrate 210 on which the light-emitting unit 220, including an organic light-emitting device (OLED) that will be described later is formed, may be supplied to the loading cluster 110. A halogenized metal layer including, for example, lithium fluoride (LiF) that will be further described later may be formed on the light-emitting unit 220.

The loading cluster 110 may include a loading chamber 112 that receives (e.g., is configured to receive) the first substrate 210 on which the light-emitting unit 220 is formed from the outside and stores (e.g., is configured to store) the first substrate 210. For example, the loading cluster 110 may include a plurality of loading chambers 112. Each of the plurality of loading chambers 112 may store the first substrate 210 on which the light-emitting unit 220 is formed. The loading cluster 110 may further include a first transfer chamber 111 connected to the loading chamber 112. The plurality of loading chambers 112 may each be connected to the first transfer chamber 111.

The first conveyance chamber P1 may connect the loading cluster 110 and the first cluster 120. In this case, the first conveyance chamber P1 may convey (e.g., be configured to convey) the first substrate 210 on which the light-emitting unit 220 is formed from the loading cluster 110 to the first cluster 120. In this case, the first conveyance chamber P1 may include a first substrate cooling unit. The first substrate cooling unit may cool the first substrate 210 that is conveyed to the first cluster 120 from the loading cluster 110 in, for example, a non-contact manner.

The first substrate cooling unit may include a first cooling plate that is installed to be spaced (e.g., spaced apart) from the first substrate 210, and a first cooler that cools (e.g., is configured to cool) the first cooling plate. For example, the first cooling plate may be disposed above and spaced from the first substrate 210. In this case, the first cooler may circulate a first refrigerant within or through the first cooling plate to drop or reduce a surface temperature of the first cooling plate. In this case, the first substrate cooling unit may be formed in the same or similar manner as a second substrate cooling unit R2 (refer to FIG. 3) that will be further described later, and may or may not be included in the first conveyance chamber P1. For convenience of explanation, an example embodiment in which the first substrate cooling unit is not included in the first conveyance chamber P1 will be described in detail below.

The first cluster 120 may include a second transfer chamber 121. The first cluster 120 may include a first sputtering chamber 122 that is connected to the second transfer chamber 121 and may be a first process chamber for performing (e.g., configured to perform) a sputtering process. In this case, the first cluster 120 may include a plurality of first sputtering chambers 122. Each of the plurality of first sputtering chambers 122 may be connected to the second transfer chamber 121. For example, each of the first sputtering chambers 122 may perform a process of depositing a first inorganic layer 231 on the first substrate 210 on which the light-emitting unit 220 is formed.

The first cluster 120 may additionally include a first mask stock chamber 123 that stores (e.g., that is configured to store) a mask for (e.g., necessary for) the sputtering process. In this case, the first mask stock chamber 123 may supply (e.g., automatically supply or may be configured to supply) the mask that is stored therein to the first sputtering chamber 122.

The first connection module M1 may include the second conveyance chamber P2. In this case, the second conveyance chamber P2 may connect the first cluster 120 and the second cluster 130, and may convey the first substrate 210 on which the light-emitting unit 220 is formed from the first cluster 120 to the second cluster 130.

The second conveyance chamber P2 may include a second shuttle S2 (refer to FIG. 3) to convey the first substrate 210 on which the light-emitting unit 220 is formed. The second shuttle S2 may perform (e.g., be configured to perform) linear motion in the second conveyance chamber P2 to convey the first substrate 210 on which the light-emitting unit 220 is formed from the first cluster 120 to the second cluster 130.

The first connection module M1 may include the second substrate cooling unit R2 (refer to FIG. 3) installed in the second conveyance chamber P2. The second substrate cooling unit R2 may be installed to be spaced (e.g., spaced apart) from the second shuttle S2 (e.g., spaced apart by a predetermined gap). For example, the second substrate cooling unit R2 may include a second cooling plate R2b installed in the second conveyance chamber P2. In this case, the second cooling plate R2b may be installed to be spaced (e.g., spaced apart) from the first substrate 210 on which the light-emitting unit 220 is formed, which is placed on or in the second shuttle S2, by a gap (e.g., a predetermined gap). For example, a distance between the second cooling plate R2b and the first substrate 210 on which the light-emitting unit 220 is formed may be less than about 20 mm. In this case, when the distance between the second cooling plate R2b and the first substrate 210 on which the light-emitting unit 220 is formed exceeds about 20 mm, cooling efficiency may deteriorate (e.g., may rapidly deteriorate), which may influence quality of a first organic layer 232 when the first organic layer 232 is formed.

The second cooling plate R2b may be cooled due to circulation of a second refrigerant supplied from a second cooler R2a that will be further described later. The cooled second cooling plate R2b may exchange heat with (i.e., may cool) the first substrate 210 on which the light-emitting unit 220 is formed. For example, the second cooling plate R2b may be formed of a metallic material, for example, copper. A surface of the second cooling plate R2b may be coated with a black body material. In this case, the black body material may include, for example, graphite or zirconium oxide. However, the second cooling plate R2b is not limited thereto, and may include all materials and/or may include a black body material that absorbs radiation energy.

The second refrigerant may include various elements. For example, the second refrigerant may include an inert gas, for example, helium, argon, carbon dioxide, nitrogen, etc.

An area (e.g., a surface area) of the second cooling plate R2b may be the same as or be different from that of the first substrate 210. For example, the area of the second cooling plate R2b may be greater than that of the first substrate 210. In this case, the second cooling plate R2b may completely cover or surround the first substrate 210, and thus the second cooling plate R2b and the first substrate 210 may more effectively exchange heat (e.g., the first substrate 210 may be effectively cooled).

The second substrate cooling unit R2 may include the second cooler R2a connected to the second cooling plate R2b. In this case, the second cooler R2a may cool the second cooling plate R2b using the second refrigerant. For example, a second refrigerant circulation passage R2c may be formed in the second cooling plate R2b so that the second refrigerant may circulate therethrough. For example, the second refrigerant circulation passage R2c may be a space for circulating the second refrigerant in or around the second cooling plate R2b and may be connected to the second cooler R2a. A separate pipe may be installed in the second cooling plate R2b.

The first connection module M1 may include a plurality of second substrate cooling units R2. The second substrate cooling units R2 may be installed to be spaced (e.g., spaced apart) from each other by a gap (e.g., a predetermined gap). For example, the second substrate cooling units R2 may be installed on one plane and be spaced (e.g., spaced apart) from each other. The second coolers R2a may be respectively connected to the second cooling plates R2b so that the second refrigerant may be supplied to and circulated in or around the second cooling plates R2b.

The second cluster 130 may include a third transfer chamber 131 that stores (e.g., temporarily stores) the first substrate 210 on which the light-emitting unit 220 is formed, which is conveyed via the second conveyance chamber P2. The second cluster 130 may include a first monomer deposition chamber 132 that is connected to the third transfer chamber 131 and is a second process chamber that performs (e.g., is configured to perform) an organic deposition process. In this case, the second cluster 130 may include a plurality of first monomer deposition chambers 132. Each of the first monomer deposition chambers 132 may be connected (e.g., radially connected) to the third transfer chamber 131. For example, in the first monomer deposition chamber 132, the first organic layer 232 may be formed on the first inorganic layer 231. As described above, the organic deposition process used to form the first organic layer 232 may use various process acts. For example, the organic deposition process may include flash evaporation.

The second cluster 130 may include a second mask stock chamber 133 that stores (e.g., is configured to store) a mask to be used (e.g., required) in each of the first monomer deposition chambers 132. In this case, the second mask stock chamber 133 may store a plurality of masks, and may supply the mask to be used in (e.g., required in) each of the first monomer deposition chambers 132.

Meanwhile, the second connection module M2 may be installed between the second cluster 130 and the third cluster 140. In this case, the second connection module M2 may include the third conveyance chamber P3 and the first turn module chamber T1. In this case, the third conveyance chamber P3 conveys (e.g., is configured to convey) the first substrate 210 on which the light-emitting unit 220 is formed from the second cluster 130 to the first turn module chamber T1, and the first turn module T1 may be formed as a flip chamber to align and reverse (e.g., configured to align and reverse) the first substrate 210 on which the light-emitting unit 220 is formed. For example, the first substrate 210 on which the light-emitting unit 220 is formed may be prepared such that downward deposition is performed in the first cluster 120 and the second cluster 130 and then upward deposition is performed in the third cluster 140 by reversing the first substrate 210 on which the light-emitting unit 220 is formed in the first turn module chamber T1 and supplying the first substrate 210 to the third cluster 140. In this case, downward deposition includes a process of placing the light-emitting unit 220 formed on the first substrate 210 to face a bottom surface of each chamber, moving a deposition material from a bottom side of each chamber toward a top side thereof, and depositing the deposition material onto the light-emitting unit 220, whereas, upward deposition includes a process of placing the light-emitting unit 220 formed on the first substrate 210 to face a top surface of each chamber, moving the deposition material from the top side of each chamber toward the bottom side thereof, and depositing the deposition material onto the light-emitting unit 220.

The second connection module M2 may include a third substrate cooling unit R3 (refer to FIG. 5) that cools the first substrate 210 that is drawn out from (e.g., removed from) the second cluster 130 and conveyed to the third cluster 140. In this case, the third substrate cooling unit R3 may be installed in at least one of the third conveyance chamber P3 and the first turn module chamber T1. For convenience of description, an example embodiment in which the third substrate cooling unit R3 is installed in the third conveyance chamber P3 will be described in detail below.

In this case, the third substrate cooling unit R3 and the third conveyance chamber P3 may be formed in the same or similar manner as the second substrate cooling unit R2 and the second conveyance chamber P2 described above. For example, the third substrate cooling unit R3 may include a third cooling plate R3b that is installed to be spaced (e.g., spaced apart) from the first substrate 210 on which the light-emitting unit 220 is formed, which is placed on a third shuttle S3 of the third conveyance chamber P3, by a gap (e.g., a predetermined gap), and a third cooler R3a may be connected to the third cooling plate R3b. In this case, the third cooling plate R3b and the third cooler R3a are the same as or are similar to the second cooling plate R2b and the second cooler R2a, respectively, described above, and thus detailed descriptions thereof will be omitted here.

The third cluster 140 may include a fourth transfer chamber 141 connected to the first turn module chamber T1. In this case, the fourth transfer chamber 141 may include a first chemical vapor chamber 142 which is a third process chamber used to dispose or form (e.g., stack) a second inorganic layer 233. For example, the fourth transfer chamber 141 may include a plurality of first chemical vapor chambers 142. Each of the first chemical vapor chambers 142 may be installed (e.g., radially installed) at the fourth transfer chamber 141 and spaced (e.g., spaced apart) from each other (e.g., spaced apart by a predetermined gap).

The second inorganic layer 233 may be formed in the first chemical vapor chamber 142 by, for example, general chemical vapor deposition (CVD) or plasma enhanced CVD (PECVD). For convenience of description, an example embodiment in which the second inorganic layer 233 is formed in the first chemical vapor chamber 142 using general CVD will be described in detail below.

The third cluster 140 may be installed to be connected to the fourth transfer chamber 141, and may include a third mask stock chamber 143 that supplies masks to be used in (e.g., required in) the first chemical vapor chambers 142. In this case, the third mask stock chamber 143 may store masks for processes (e.g., necessary for processes), and then supply the masks to each of the first chemical vapor chambers 142 in which the processes are performed.

Meanwhile, the second turn module chamber T2 may be connected to the third cluster 140 formed as described above. For example, the second turn module chamber T2 may be connected to the fourth transfer chamber 141 and may reverse (e.g., flip) and convey the first substrate 210 on which the light-emitting unit 220 is formed. For example, the second turn module chamber T2 may be a flip chamber similar to the first turn module chamber T1 described above.

The fourth conveyance chamber P4 may be connected to the second turn module chamber T2. The fourth conveyance chamber P4 may convey the first substrate 210 on which the light-emitting unit 220 is formed and to which a thin film encapsulation process has been completed to the unloading cluster 150.

The unloading cluster 150 may include a fifth transfer chamber 151. The unloading cluster 150 may be connected to the fifth transfer chamber 151 and include an unloading chamber 152 that removes (e.g., carries out) the first substrate 210, which is conveyed from the fifth transfer chamber 151 and on which the light-emitting unit 220 is formed, to the outside. In this case, the unloading cluster 150 may include a plurality of unloading chambers 152. The unloading chambers 152 may be installed (e.g., radially installed) at the fifth transfer chamber 151.

A method of performing the thin film encapsulation process using the thin film encapsulation manufacturing apparatus 100 and the display apparatus 200 will be described in detail below.

The display apparatus 200 may have (e.g., be formed to have) various forms. For example, the display apparatus 200 may include a liquid crystal display (LCD) apparatus, a plasma display apparatus, an organic light emitting display apparatus, and the like. For convenience of description, an example embodiment in which the display apparatus 200 includes the organic light emitting display apparatus will be described in detail below.

The light-emitting unit 220 may be formed on the first substrate 210. In this case, the light-emitting unit 220 may include a thin film transistor (TFT). A passivation layer 221 may be formed in the light-emitting unit 220 to cover the TFT. The OLED may be formed on the passivation layer 221.

The first substrate 210 may be formed of a glass material, but is not limited thereto, and may also be formed of a plastic material, or a metal material such as stainless steel (SUS) or titanium (Ti).

A buffer layer 222 formed of an organic compound and/or inorganic compound may be further formed on an upper surface of the first substrate 210 and may be formed of, for example, silicon oxide ($SiO_x$ ($x \geq 1$)) or silicon nitride ($SiN_x$ ($x \geq 1$)).

An active layer 223 arranged in a pattern (e.g., a predetermined pattern) may be formed on the buffer layer 222, and then be covered by (e.g., buried by) a gate insulating layer 224. The active layer 223 includes a source region 223a and a drain region 223c, and further includes a channel area 223b therebetween. In this case, the active layer 223 may be formed of amorphous silicon, but is not limited thereto, and may also be formed of an oxide semiconductor. For example, the oxide semiconductor may include an oxide formed of a material selected from the group consisting of 12, 13, and 14 Group metal elements such as zinc (Zn), indium (In), gallium (Ga), tin (Sn), cadmium (Cd), germanium (Ge), hafnium (Hf), and a combination of these. For example, the active layer 223 formed of a semiconductor may include G-I-Z-O[a($In_2O_3$)b($Ga_2O_3$)c(ZnO)] (a, b, and c are real numbers that satisfy conditions of a≥0, b≥0, and c>0). For convenience of description, an example embodiment in which the active layer 223 is formed of amorphous silicon will be described in detail below.

The active layer 223 may be formed by forming an amorphous silicon layer on the buffer layer 222, crystallizing the amorphous silicon layer, forming a polycrystalline silicon layer, and patterning the polycrystalline silicon layer. The active layer 223 may include source and drain regions 223a and 223c that are doped with impurities according to a TFT type such as a driving TFT or a switching TFT.

A gate electrode 225 corresponding to the active layer 223 and an interlayer insulating layer 226 covering the gate electrode 225 may be formed on the gate insulating layer 224.

After forming a contact hole in the interlayer insulating layer 226 and the gate insulating layer 224, a source electrode 227a and a drain electrode 227b may be formed on the interlayer insulating layer 226 so as to respectively contact the source region 223a and the drain region 223c.

Meanwhile, because a reflective layer is formed simultaneously with the formation of the source/drain electrodes 227a and 227b as described above, the source/drain electrodes 227a and 227b may be formed of electrically conductive (e.g., highly electrically conductive) materials having a thickness at which light reflection is possible. The source/drain electrodes 227a and 227b may be formed of a metal material such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or a compound of these.

The passivation layer 221 may be formed on the TFT and the reflective layer formed as described above. A pixel electrode 228a of the OLED is formed on the passivation layer 221. The pixel electrode 228a contacts the drain electrode 227b of the TFT through a via hole formed in the passivation layer 221. The passivation layer 221 may be formed of an inorganic material and/or an organic material, and in a single-layer structure or a structure including at least two layers, and may be formed as a planarization layer such that an upper surface thereof is planarized regardless of a curve or shape of a lower layer, whereas the passivation layer 221 may be curved along (e.g., corresponding to) the curve of the lower layer. The passivation layer 221 may be formed of a transparent insulating material so as to achieve resonating effects (e.g., optical resonance).

After forming the pixel electrode 228a on the passivation layer 221, a pixel defining layer 229 may be formed of an organic material and/or an inorganic material to cover the pixel electrode 228a and the passivation layer 221 and is opened so as to expose the pixel electrode 228a.

An organic layer 228b and an opposite electrode 228c are formed at least on the pixel electrode 228a.

The pixel electrode 228a may function as an anode electrode, and the opposite electrode 228c may function as a cathode electrode, however, the polarities of the pixel electrode 228a and the opposite electrode 228c may be switched.

The pixel electrode 228a may be formed of a material having a high work function, for example, a transparent conductor such as indium tin oxide (ITO), indium zinc oxide (IZO), indium oxide ($In_2O_3$), and zinc oxide (ZnO).

The opposite electrode 228c may be formed of a metal such as Ag, Mg, Al, Pt, Pd, Au, Ni, Nd, Ir, Cr, Li, Ca or a compound of these; for example, the opposite electrode 228c may be formed of Mg, Ag, or Al having a small thickness so as to be a semi-transmissive reflective layer so that light may be transmitted therethrough after optical resonance.

The pixel electrode 228a and the opposite electrode 228c are insulated from each other by the organic layer 228b so that light is emitted from an organic emissive layer by applying voltages of opposite polarities to the organic layer 228b.

The organic layer 228b may include the organic emissive layer. In this case, the organic layer 228b may be formed of a low-molecular or a polymer organic layer. When the organic layer 228b is formed of a low-molecular layer, the organic layer 228b may have a structure in which a hole injection layer (HIL), a hole transport layer (HTL), an electron transport layer (ETL), and an electron injection layer (EIL), in addition to an emissive layer (EML), are stacked in a single-layer or multi-layer structure, and various organic materials such as CuPc (copper phthalocyanine), NPB (N,N'-di(1-naphthyl)-N,N'-diphenylbenzidine), Alq3 (tris(8-hydroxyquinolinato)aluminum), etc. may be used. The low-molecular organic layers may be formed by using vacuum deposition. In this case, the HIL, the HTL, the ETL, and the EIL are common layers which may be commonly applied to red, green, and blue pixels. Thus, the common layers may be formed to cover the entire pixels like the opposite electrode 228c.

When the organic layer 228b is formed of a polymer organic layer, the polymer organic layer may be formed of the HTL and the EML. In this case, PEDOT (poly(3,4-ethylenedioxythiophene)) may be used as the HTL, and a polymer organic material such as a polyphenylene vinylene based material or a polyfluorene based material is used as the EML, which may be formed by using screen printing, inkjet printing, a fine metal mask process, a laser thermal transfer process, or the like.

Meanwhile, the EML as described above may have (e.g., be formed to have) various forms. For example, a blue EML, a green EML, and a red EML may be formed in each sub-pixel to form a single unit pixel. Also, besides the blue, green, and red EMLs as described above, EMLs of other colors may also be formed in a sub-pixel. For example, in addition to the blue, green, and red EMLs, the blue EML, the green EML, and the red EML may be layered (e.g., stacked) to form a white EML as a sub-pixel so as to form a single unit pixel.

Furthermore, although the EML formed of an additional light emitting material in each pixel is described above, the present invention is not limited thereto. The EML may be formed commonly in the entire pixels irrespective of locations of the pixels. In this case, the EML may be formed by vertically stacking or mixing layers including a light emitting material that emits, for example, red, green, and blue light. As long as white light is emitted, a combination of other colors is also possible. A color conversion layer or a color filter that converts the emitted white light into a color (e.g., a predetermined color) may be further included.

The organic layer 228b is not limited thereto, and other various examples of the organic layer 228b may also be applied. For convenience of description, an example embodiment in which a blue EML, a green EML, and a red EML are formed as a sub-pixel to form a single unit pixel will be described in detail below.

Meanwhile, after the first substrate 210 on which the light-emitting unit 220 is formed is prepared, an encapsulation unit 230 may be formed when the first substrate 210 enters the thin film encapsulation manufacturing apparatus 100. In this case, the encapsulation unit 230 may be formed by stacking (e.g., sequentially stacking) the first inorganic layer 231, the first organic layer 232, and the second inorganic layer 233 as described above.

For example, the first organic layer 232 may be formed of a polymer, and may also be a single layer or multiple layers (e.g., stacked layers) that is formed of, for example, one of polyethylene terephthalate, a polyimide, a polycarbonate, an epoxy, a polyethylene and a polyacrylate. The first organic layer 232 may also be formed of a polyacrylate; for example, the first organic layer 232 may include a polymerized monomer composition including a diacrylate monomer or a triacrylate monomer. The monomer composition may further include a monoacrylate monomer. The monomer composition may further include a suitable photoinitiator such as thermoplastic polyolefin (TPO), but is not limited thereto.

The first inorganic layer 231 and the second inorganic layer 233 may be single layers or stacked layers including a metal oxide or a metal nitride. For example, the first inorganic layer 231 and the second inorganic layer 233 may include one of silicon nitride (e.g., $SiN_x$), aluminum oxide (e.g., $Al_2O_3$), silicon oxide (e.g., $SiO_2$), and titanium oxide (e.g., $TiO_2$). In this case, the second inorganic layer 233 may be formed to or configured to prevent or reduce moisture from permeating into the light-emitting unit 220.

Meanwhile, the halogenized metal layer including, for example, lithium fluoride (e.g., LiF) may be further included between the light-emitting unit 220 and the first inorganic layer 231. The halogenized metal layer may prevent or reduce damage to the light-emitting unit 220 when the first inorganic layer 231 is formed using a sputtering process.

The first organic layer 232 may be smaller than (e.g., may have a smaller surface area than) the second inorganic layer 233. In this case, the first organic layer 232 may be covered (e.g., completely covered) by the second inorganic layer 233.

A method of forming the encapsulation unit 230 as described above may also include loading the first substrate 210 on which the light-emitting unit 220 is formed into the loading chamber 112. In this case, various loading methods may be used. For example, the first substrate 210 on which the light-emitting unit 220 is formed may be loaded into a cassette, and then the cassette may be loaded into the loading chamber 112. The first substrate 210 on which the light-emitting unit 220 is formed may also be supplied or moved into the loading chamber 112 by a conveyance unit, for example, an external robot arm.

Meanwhile, the first substrate 210 that is supplied as described above may be supplied or moved to the first transfer chamber 111 from the loading chamber 112. In this case, a robot arm or the like may be installed in the first transfer chamber 111 to move the first substrate 210. For example, before the first substrate 210 is conveyed from the loading chamber 112 to the first transfer chamber 111, pressures of or in the loading chamber 112 and the first transfer chamber 111 may be controlled to be substantially equal to each other (e.g., the pressures may be equalized).

The first substrate 210 conveyed to the first transfer chamber 111 as described above may be conveyed again from the first transfer chamber 111 to the first conveyance chamber P1. In this case, when the first substrate 210 is conveyed, internal pressures of the first transfer chamber 111 and the first conveyance chamber P1 may be controlled to be uniform (e.g., the internal pressures may be equalized).

In an example embodiment in which the first substrate cooling unit is installed in the first conveyance chamber P1, the first substrate 210 that has entered the first conveyance chamber P1 may be cooled by the first substrate cooling unit, for example, in a non-contact manner. For convenience of description, an example embodiment in which the first substrate cooling unit is not installed, that is, a case where the first substrate 210 is supplied to the first cluster 120 via the first conveyance chamber P1 without cooling the first substrate 210, will be described in detail below.

The first conveyance chamber P1 may convey the first substrate 210 to the second transfer chamber 121 of the first cluster 120. In this case, when the first substrate 210 is conveyed, internal pressures of the first conveyance chamber P1 and the second transfer chamber 121 may be maintained substantially uniform (e.g., the internal pressures may be equalized).

The first substrate 210 conveyed as described above may be loaded into one of the plurality of first sputtering chambers 122 from the second transfer chamber 121. In this case, the one of the plurality of first sputtering chambers 122 into which the first substrate 210 is loaded may be determined (e.g., previously determined or predetermined). For example, an order or a sequence of the first sputtering chambers 122 may be determined in one direction (e.g., each first sputtering chamber 122 may be ordered or sequenced according to a position on the first cluster 120). Identification (ID) may be given to each of the first sputtering chambers 122 or to the first substrate 210. However, a method of determining the order or the sequence of the first sputtering chambers 122 is not limited thereto, and may be determined in various ways. For convenience of description, an example embodiment in which the order is determined in one direction will be described below.

The first substrate 210 may be loaded into a first one of the plurality of first sputtering chambers 122 whose order or sequence is determined according to an ID given to each of the plurality of first sputter chambers 122 or to the first substrate 210. For example, the first substrate 210 may be loaded into the one of the first sputtering chambers 122 such that the ID of the first substrate 210 and the order or sequence of the one first sputtering chamber 122 correspond to or are consistent with each other.

Meanwhile, when the first inorganic layer 231 is formed using the sputtering process as described above, masks used in the sputtering process may be conveyed from the first mask stock chamber 123 to the first sputtering chambers 122 in which the sputtering process is to be performed. In this case, the masks may enter and be stored in at least one of a plurality of first mask stock chambers 123. For example, an order of the masks that enter may be determined such that the masks are conveyed to the first sputtering chambers 122 in which the sputtering process is to be performed in advance of (e.g., before) the first substrate 210 entering the first sputtering chambers 122. However, the present invention is not limited thereto, and the masks may enter concurrently (e.g., simultaneously) with the first substrate 210.

Meanwhile, after the first substrate 210 enters one of the plurality of first sputtering chambers 122, the one first sputtering chamber 122 may form the first inorganic layer 231 on the light-emitting unit 220. In this case, the first inorganic layer 231 may be the same as or similar to that described above, and thus a detailed description thereof will be omitted here.

When the first inorganic layer 231 is formed (e.g., completely formed) as described above, the first substrate 210 may then be conveyed from the first sputtering chamber 122 to the second transfer chamber 121. In this case, pressures of the first sputtering chamber 122 and the second transfer chamber 121 may be controlled to be substantially the same or equal.

The second transfer chamber 121 may convey the first substrate 210 on which the first inorganic layer 231 is formed to the second conveyance chamber P2. In this case, the first substrate 210 may be conveyed to the second shuttle S2 by, for example, the robot arm. For example, the first substrate 210 may be conveyed from the second transfer chamber 121 to the second conveyance chamber P2 while internal pressures of the second transfer chamber 121 and the second conveyance chamber P2 are maintained uniform or substantially equal.

During the conveyance of the first substrate 210, the first substrate 210 may be cooled in the second conveyance chamber P2 by the second substrate cooling unit R2. For example, when the first substrate 210 is placed on or in the second shuttle S2, the second cooler R2a may cool the second cooling plate R2b by circulating the second refrigerant in or through the second cooling plate R2b. When a surface temperature of the second cooling plate R2b drops (e.g., is reduced), radiation energy emitted from the first inorganic layer 231, the light-emitting unit 220, and the first substrate 210 having a higher temperature than that of the second cooling plate R2b arrives at the second cooling plate R2b and is thermally exchanged (e.g., absorbed), and thus a temperature of the first substrate 210 may drop (e.g., may be reduced). In this case, although the second cooler R2a may operate when the first substrate 210 enters the second conveyance chamber P2 as described above, the second refrigerant may be continuously supplied to the second cooling plate R2b. For convenience of description, an example embodiment in which the second cooler R2a operates when the first substrate 210 enters the second conveyance chamber P2 will be described below.

When the above process is completed, the first substrate 210 may be conveyed to the second cluster 130. In this case, the first substrate 210 may be conveyed to the third transfer chamber 131 connected to the second conveyance chamber P2, and when the first substrate 210 is conveyed, pressures of the second conveyance chamber P2 and the third transfer chamber 131 may be maintained to be substantially the same or equal.

The first substrate 210 conveyed to the third transfer chamber 131 as described above may be further conveyed from the third transfer chamber 131 to the first monomer deposition chamber 132. In this case, a method of conveying the first substrate 210 to one of the plurality of first monomer deposition chambers 132 may be similar to or the same as the method of conveying the first substrate 210 to one of the plurality of first sputtering chambers 122 as described above. For example, the plurality of first monomer deposition chambers 132 may be numbered in the same order or sequence as that of the plurality of first sputtering chambers 122. For example, as the first inorganic layer 231 is formed in the first one of the plurality of first sputtering chambers 122, the first organic layer 232 may be formed in a first one of the plurality of first monomer deposition chambers 132.

The third transfer chamber 131 and the first monomer deposition chamber 132 may have (e.g., be set to have) the same or substantially the same pressures. The first monomer deposition chamber 132 may form the first organic layer 232 on the first inorganic layer 231. For example, when the first substrate 210 is loaded into the first monomer deposition chamber 132, a monomer and a photoinitiator, which may be polymerized by applying ultraviolet (UV) rays or heat, may be deposited using flash evaporation.

When the above process is completed, the first organic layer 232 including, for example, a polymer, may be formed by applying UV rays or heat to a surface on which the monomer is deposited and polymerizing the monomer to increase its hardness. For example, the first organic layer 232 may be the same as or similar to that described above, and thus a detailed description thereof will be omitted here.

In this case, a mask used to form the first organic layer 232 may be supplied to the first monomer deposition chamber 132 after being stored in the second mask stock chamber 133. In this case, a method of supplying the mask from the second mask stock chamber 133 to the first monomer deposition chamber 132 may be similar to the method of supplying a mask from the first mask stock chamber 123 to the first sputtering chamber 122, and thus, a detailed description thereof will be omitted here.

Meanwhile, after the first organic layer 232 is formed on the first inorganic layer 231, the first substrate 210 conveyed to the third transfer chamber 131 may be further conveyed from the third transfer chamber 131 to the second connection module M2. For example, the first substrate 210 may be conveyed from the third transfer chamber 131 to the third conveyance chamber P3. In this case, when the first substrate 210 is conveyed, internal pressures of the third conveyance chamber P3 and the third transfer chamber 131 may be controlled to be substantially the same or equal.

The third shuttle S3 may be disposed in the third transfer chamber 131 and may convey the first substrate 210. In this case, the third substrate cooling unit R3 installed in the third transfer chamber 131 may operate so that a temperature (e.g., a surface temperature) of the first substrate 210 may drop or be reduced. In this case, a method of operating the third substrate cooling unit R3 may be the same as or similar to the method of operating the second substrate cooling unit R2, and thus a detailed description thereof will be omitted here.

When the above process is completed, the first substrate 210 may be supplied from the third transfer chamber 131 to the first turn module chamber T1. In this case, the first turn module chamber T1 may reverse (e.g., may reverse an orientation of or flip) the first substrate 210 by, for example, 180 degrees. For example, the first cluster 120 and the second cluster 130 may use downward deposition in which a deposition material is provided in a downward direction (e.g., moved downwardly) to deposit the first inorganic layer 231 and the first organic layer 232, and the third cluster 140 may use upward deposition in which a deposition material is provided in an upward direction (e.g., moved upwardly) to deposit the second inorganic layer 233. Thus, for the upward deposition, the first substrate 210 may be reversed by 180 degrees. That is, when the first substrate 210 is reversed, the first inorganic layer 231 and the first organic layer 232 that are provided on the first substrate 210 may be provided to face in a downward direction (e.g., the first substrate 210 may be orientated such that the first inorganic layer 231 may be above the first organic layer 232).

After the first substrate 210 is reversed in the first turn module chamber T1 as described above, the first substrate 210 may be supplied to the fourth transfer chamber 141. In this case, internal pressures of the first turn module chamber T1 and the fourth transfer chamber 141 may be controlled to be substantially the same or equal.

Meanwhile, the first substrate 210 conveyed to the fourth transfer chamber 141 may be further conveyed to the first chemical deposition chamber 142. In this case, internal pressures of the fourth transfer chamber 141 and the first chemical vapor chamber 142 may be controlled to be substantially the same or equal.

When the second inorganic layer 233 is deposited as described above, a mask used in (e.g., necessary in) the first chemical vapor chamber 142 may be supplied from the third mask stock chamber 143. In this case, an operation of the third mask stock chamber 143 may be similar to that of the first mask stock chamber 123 or the second mask stock chamber 133, and thus a detailed description thereof will be omitted here.

Meanwhile, when the second inorganic layer 233 is deposited (e.g., completely deposited) as described above, the display apparatus 200 may be conveyed from the fourth transfer chamber 141 to the second turn module chamber T2. In this case, the second turn module chamber T2 may restore the display apparatus 200 to an original orientation (e.g., an original state) by reversing the display apparatus 200 by, for example, 180 degrees.

The display apparatus 200 restored to the original orientation as described above may be conveyed from the second turn module chamber T2 to the fifth transfer chamber 151 via the fourth conveyance chamber P4. In this case, after the display apparatus 200 is conveyed from the fourth conveyance chamber P4 to the fifth transfer chamber 151 while internal pressures of the second turn module chamber T2 and the fourth conveyance chamber P4 are maintained substantially uniform (e.g., maintained equal or substantially equal), the display apparatus 200 may be conveyed to the fifth transfer chamber 151 by allowing internal pressures of the fourth conveyance chamber P4 and the fifth transfer chamber 151 to be maintained substantially uniform (e.g., maintained equal).

The display apparatus 200 manufactured as described above may be loaded into the unloading chambers 152 from the fifth transfer chamber 151 and stored in one of the unloading chambers 152. In this case, the display apparatus 200 may be conveyed when internal pressures of the fifth transfer chamber 151 and the unloading chambers 152 are controlled to be substantially the same (e.g., when the internal pressures are equal or substantially equal).

Meanwhile, there may be various methods of loading the display apparatus 200 as described above into the unloading chambers 152. For example, the unloading chambers 152 may be controlled by setting an order or sequence thereof (e.g., previously setting an order or sequence thereof), and, when the display apparatus 200 is loaded (e.g., completely loaded) into a randomly selected one of the unloading chambers 152, the other unloading chambers 152 may be controlled to store another display apparatus 200. One display apparatus 200 may be stored in one of the plurality of unloading chambers 152 and may be conveyed from the fifth transfer chamber 151 randomly to one of the plurality of unloading chambers 152 that are determined to not have the display apparatus 200 stored therein.

As described above, the thin film encapsulation manufacturing apparatus 100 may perform an in-line thin film encapsulation, thereby optimizing or reducing a time taken to perform the thin film encapsulation.

The thin film encapsulation manufacturing apparatus 100 may adjust a thickness of each layer when a multilayer thin film encapsulation is formed, and upward and downward film formation may be performed (e.g., simultaneously preformed), thereby conveniently forming the multilayer thin film encapsulation.

For example, the thin film encapsulation manufacturing apparatus 100 may include the loading cluster 110 and the unloading cluster 150, and thus, thin film encapsulation may be formed in one line, thereby increasing productivity.

The thin film encapsulation manufacturing apparatus 100 may drop or reduce a temperature of the first substrate 210 before each process is performed, and thus an effect (e.g., a factor) caused by a temperature rise or increase of the first substrate 210 due to each process may be reduced or prevented, thereby ensuring prompt and/or complete thin film encapsulation.

Furthermore, the thin film encapsulation manufacturing apparatus 100 may drop or reduce the temperature of the first substrate 210 before a first organic layer 232 is formed, thereby improving quality of the first organic layer 232 formed after the first inorganic layer 231 is formed.

Figure 6:
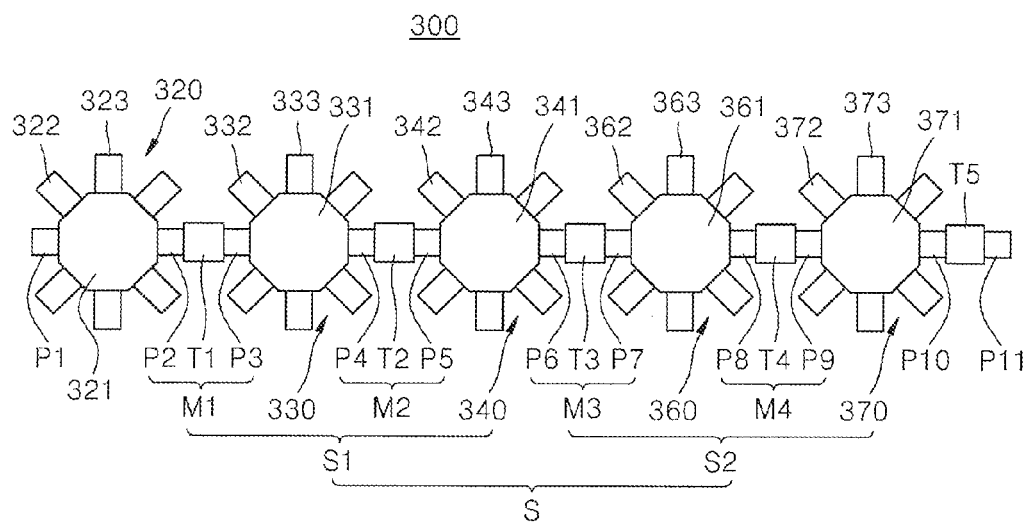
FIG. 6 is a conceptual diagram of a thin film encapsulation manufacturing apparatus according to another embodiment of the present invention.
Figure 7:
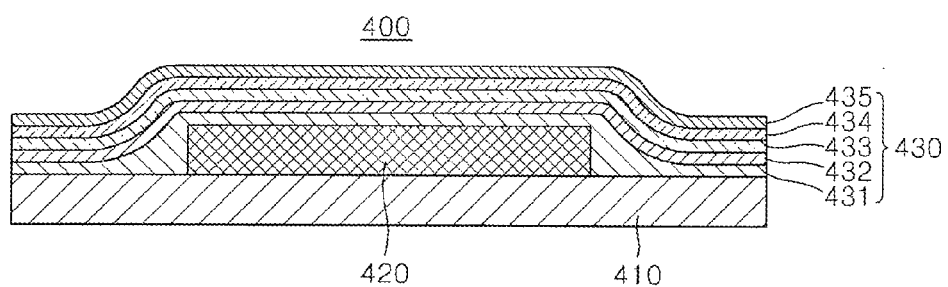
FIG. 7 is a cross-sectional view of a display apparatus manufactured using the thin film encapsulation manufacturing apparatus shown in FIG. 6.

FIG. 6 is a conceptual diagram of a thin film encapsulation manufacturing apparatus 300 according to another embodiment of the present invention. FIG. 7 is a cross-sectional view of a display apparatus 400 manufactured using the thin film encapsulation manufacturing apparatus 300 shown in FIG. 6.

Referring to FIGS. 6 and 7, the thin film encapsulation manufacturing apparatus 300 may include a loading cluster, the first conveyance chamber P1, a first cluster 320, the first connection module M1, a second cluster 330, the second connection module M2, and a third cluster 340. In this case, the first connection module M1, the second cluster 330, the second connection module M2, and the third cluster 340 may be installed (e.g., sequentially installed). The first connection module M1, the second cluster 330, the second connection module M2, and the third cluster 340 may form a single organic/inorganic layer formation module S. A plurality of organic/inorganic layer formation modules S may be formed and include a first organic/inorganic layer formation module S1 connected to the first cluster 320 and a second organic/inorganic layer formation module S2 connected to the first organic/inorganic layer formation module S1.

The first organic/inorganic layer formation module S1 and the second organic/inorganic layer formation module S2 may form (e.g., sequentially form) a first organic layer 432 and a second inorganic layer 433 alternately, and thus the first organic layer 432, the second inorganic layer 433, a second organic layer 434, and a third inorganic layer 435 that will be further described later may be formed.

The loading cluster, the first conveyance chamber P1 of the first organic/inorganic layer formation module S1, the first cluster 320, the first connection module M1, the second cluster 330, the second connection module M2, and the third cluster 340 may be connected (e.g., sequentially connected) to each other. A first connection module, a second cluster, a second connection module, and a third cluster of the second organic/inorganic layer formation module S2 may be connected (e.g., sequentially connected) to the third cluster 340. However, to avoid confusion of description, the first connection module, the second cluster, the second connection module, and the third cluster of the second organic/inorganic layer formation module S2 that are connected to the third cluster 340 are respectively renamed as a third connection module M3, a fourth cluster 360, a fourth connection module M4, and a fifth cluster 370 and will be further described in detail below.

The thin film encapsulation manufacturing apparatus 300 may include the loading cluster, the first conveyance chamber P1, the first cluster 320, the first connection module M1, the second cluster 330, the second connection module M2, the third cluster 340, the third connection module M3, the fourth cluster 360, the fourth connection module M4, the fifth cluster 370, a fifth turn module chamber T5, an eleventh conveyance chamber P11, and an unloading cluster.

The first conveyance chamber P1 may include a first substrate cooling unit. The first substrate cooling unit may cool a first substrate 410 conveyed to the first cluster 320, for example, in a non-contact manner. In this case, the first substrate cooling unit may be the same as or similar to that described above, and thus a detailed description thereof will be omitted here. For convenience of description, an example embodiment in which the first substrate cooling unit is not included in the first conveyance chamber P1 will be described in detail below.

Meanwhile, the first connection module M1 and the second connection module M2 may be formed in the same or similar manner as the first connection module M1 and the second connection module M2 described with reference to FIGS. 1 and 2. For example, the first connection module M1 may include the second conveyance chamber P2, the first turn module chamber T1, and the third conveyance chamber P3. The first connection module M1 may include a second substrate cooling unit that cools the first substrate 410, for example, in a non-contact manner. In this case, the second substrate cooling unit may be installed in at least one of the second conveyance chamber P2, the first turn module chamber T1, and the third conveyance chamber P3. For convenience of description, an example embodiment in which the second substrate cooling unit is installed in each of the second conveyance chamber P2 and the third conveyance chamber P3 will be described in detail below.

The second substrate cooling unit described above may include a second cooling plate and a second cooler. In this case, the second cooling plate and the second cooler may be the same as or similar to those described with reference to FIGS. 1 and 2, and thus detailed descriptions thereof will be omitted here.

The second connection module M2 may include the fourth conveyance chamber P4, the second turn module chamber T2, and a fifth conveyance chamber P5. The second connection module M2 may include a third substrate cooling unit installed in at least one of the fourth conveyance chamber P4, the second turn module chamber T2, and the fifth conveyance chamber P5. For convenience of description, an example embodiment in which the third substrate cooling unit is installed in each of the fourth conveyance chamber P4 and the fifth conveyance chamber P5 will be described in detail below.

The third connection module M3 may include a sixth conveyance chamber P6, a third turn module chamber T3, and a seventh conveyance chamber P7. The third connection module M3 may include a fourth substrate cooling unit installed in at least one of the sixth conveyance chamber P6, the third turn module chamber T3, and the seventh conveyance chamber P7. In this case, the fourth substrate cooling unit may be formed in the same or similar manner as the second substrate cooling unit, and thus a detailed description thereof will be omitted here.

The fourth connection module M4 may include an eighth conveyance chamber P8, a fourth turn module chamber T4, and a ninth conveyance chamber P9. The fourth connection module M4 may include a fifth substrate cooling unit installed in at least one of the eighth conveyance chamber P8, the fourth turn module chamber T4, and the ninth conveyance chamber P9. In this case, the fifth substrate cooling unit may be formed in the same or similar manner as the third substrate cooling unit, and thus a detailed description thereof will be omitted here.

The thin film encapsulation manufacturing apparatus 300 described above may selectively include the second through fifth substrate cooling units. For example, the third and fifth substrate cooling units may not be installed in the thin film encapsulation manufacturing apparatus 300. For convenience of description, an example embodiment, in which the thin film encapsulation manufacturing apparatus 300 includes each of the second through fifth substrate cooling units, will be described in more detail below.

Meanwhile, the first through eleventh conveyance chambers P1 through P11 described above may be formed in the same as or a similar manner to the first through fourth conveyance chambers P1 through P4 described above with reference to FIGS. 1 and 2, and the first substrate 410 on which an light-emitting unit 420 is formed may be conveyed in the same manner or in a similar manner, and thus, detailed descriptions thereof will be omitted here.

The first through fifth turn module chambers T1 through T5 may be formed in the same or similar manner as the first and second turn module chambers T1 and T2 described above with reference to FIGS. 1 and 2, and the first substrate 410 on which the light-emitting unit 420 is formed may be aligned or reversed and conveyed in the same manner or in a similar manner, and thus, detailed descriptions thereof will be omitted here.

Meanwhile, the loading cluster and the unloading cluster may be formed in the same or similar manner as described above with reference to FIGS. 1 and 2, and thus detailed descriptions thereof are omitted below. The loading cluster and the unloading cluster may be included or may not be included in the thin film encapsulation manufacturing apparatus 300, and thus, for convenience of description, an example embodiment in which the loading cluster and the unloading cluster are not included will be described in detail below.

The first cluster 320 may include a second transfer chamber 321, a first sputtering chamber 322, and a first mask stock chamber 323. In this case, the first cluster 320 may be formed in the same or similar manner as that described above with reference to FIGS. 1 and 2, and thus a detailed description thereof will be omitted here.

The second cluster 330 may include a third transfer chamber 331, a first monomer deposition chamber 332, and a second mask stock chamber 333. In this case, the second cluster 330 may be formed in the same or similar manner as that described above with reference to FIGS. 1 and 2, and thus a detailed description thereof will be omitted here.

The third cluster 340 may include a fourth transfer chamber 341, a first chemical vapor chamber 342, and a second mask stock chamber 343. In this case, the third cluster 340 may be formed in the same or similar manner as that described above with reference to FIGS. 1 and 2, and thus a detailed description thereof will be omitted here. For convenience of description, an example embodiment in which a second inorganic layer 433 is formed in the first chemical vapor chamber 342 using PECVD will be described in detail below.

Meanwhile, the fourth cluster 360 may include a sixth transfer chamber 361, a second monomer deposition chamber 362, and a fourth mask stock chamber 363. In this case, the fourth cluster 360 may form the second organic layer 434 on the second inorganic layer 433. For example, the fourth cluster 360 may be formed in the same or similar manner as the second cluster 330, and the second organic layer 434 may be formed in the same or similar manner as the first organic layer 432, and thus detailed descriptions thereof will be omitted here.

The fifth cluster 370 may include a seventh transfer chamber 371, a second chemical vapor chamber 372, and a fifth mask stock chamber 373. In this case, the fifth cluster 370 may form a third inorganic layer 435 on the second organic layer 434. For example, the fifth cluster 370 may be formed in the same or similar manner to the third cluster 340, and the third inorganic layer 435 may be formed in the same or similar manner as the second inorganic layer 433, and thus detailed descriptions thereof will be omitted here.

Meanwhile, a method of performing a thin film encapsulation process by using the thin film encapsulation manufacturing apparatus 300 and a structure of the display apparatus 400 will be described in detail below.

First, the first substrate 410 on which the light-emitting unit 420 is formed may be manufactured. In this case, the first substrate 410 and the light-emitting unit 420 may be the same as or similar to the first substrate 210 and the light-emitting unit 220, respectively, described above with reference to FIGS. 1 and 2, and thus detailed descriptions thereof will be omitted here.

Meanwhile, after the first substrate 410 on which the light-emitting unit 420 is formed is prepared, an encapsulation unit 430 may be formed when the first substrate 410 enters the thin film encapsulation manufacturing apparatus 300. In this case, the encapsulation unit 430 may include at least one structure (e.g., a sandwich or layered structure) in which at least one organic layer is formed (e.g., inserted) between at least two inorganic layers. Alternatively, the encapsulation unit 430 may include at least one structure (e.g., a sandwich or layered structure) in which at least one inorganic layer is formed (e.g., inserted) between at least two organic layers.

For example, the encapsulation unit 430 may be formed by stacking (e.g., sequentially stacking) a first inorganic layer 431, the first organic layer 432, the second inorganic layer 433, the second organic layer 434, and the third inorganic layer 435 as described above.

For example, the first organic layer 432 and the second organic layer 434 may be formed of a polymer, and may be single layers or stacked layers that are formed of one of polyethylene terephthalate, a polyimide, a polycarbonate, an epoxy, polyethylene and polyacrylate. The first organic layer 432 and the second organic layer 434 may be formed of polyacrylate, and in detail, may include a polymerized monomer composition including a diacrylate monomer or a triacrylate monomer. The monomer composition may further include a monoacrylate monomer. A suitable photoinitiator, such as a TPO, may be further included in the monomer composition, but is not limited thereto.

The first through third inorganic layers 431, 433, and 435 may be single layers or stacked layers including a metal oxide or a metal nitride. For example, the first through third inorganic layers 431, 433, and 435 may include one of silicon nitride (e.g., $SiN_x$), aluminum oxide (e.g., $Al_2O_3$), silicon oxide (e.g., $SiO_2$), and titanium oxide (e.g., $TiO_2$). In this case, the third inorganic layer 435 may be formed to prevent or reduce moisture permeating into the light-emitting unit 420.

Meanwhile, a halogenized metal layer including, for example, lithium fluoride (e.g., LiF) may be further included between the light-emitting unit 420 and the first inorganic layer 431. The halogenized metal layer may prevent or reduce damage to the light-emitting unit 420 when the first inorganic layer 431 is formed using a sputtering process.

The first organic layer 432 may be smaller than (e.g., a surface area of the first organic layer 432 may be smaller than) the second inorganic layer 433, and the second organic layer 434 may be smaller than (e.g., a surface area of the second organic layer 434 may be smaller than) the third inorganic layer 435. In this case, the first organic layer 432 may be covered (e.g., completely covered) by the second inorganic layer 433, and the second organic layer 434 may be covered (e.g., completely covered) by the third inorganic layer 435.

A method of forming the encapsulation unit 430 as described above may include maintaining a vacuum degree (e.g., an entire vacuum degree) of the thin film encapsulation apparatus 300 at 5E-4 Pa or less (i.e., $5*10^{-4}$ Pa or less), moving masks from the first through fifth mask stock chambers 323, 333, 343, 363, and 373 into the first sputtering chamber 322, the first monomer deposition chamber 332, the first chemical vapor chamber 342, the second monomer deposition chamber 362, and the second chemical vapor chamber 372, respectively, using, for example, a robot arm, and mounting the masks in each chamber.

When the above process is performed, the first substrate 410 on which the light-emitting unit 420 is formed may be mounted in the first conveyance chamber P1, and a vacuum degree of the first conveyance chamber P1 may be maintained to be substantially the same as or equal to that of the second transfer chamber 321, and then a gate valve may be opened to move the first substrate 410 to the second transfer chamber 321. In this case, the first substrate 410 may be moved by, for example, a robot. In this case, as described above, a halogenized metal layer including, for example, lithium fluoride (e.g., LiF) may be formed or may not be formed on the light-emitting unit 420 to prevent or reduce damage to the light-emitting unit 420 during a sputtering process. For convenience of description, an example embodiment in which the halogenized metal layer is not formed on the light-emitting unit 420 but in which the first inorganic layer 413 is formed will be described in detail below.

When the first substrate cooling unit is installed in the first conveyance chamber P1, the first substrate 410 that enters the first conveyance chamber P1 may be cooled by the first substrate cooling unit, for example, in a non-contact manner. For convenience of description, an example embodiment in which the first substrate cooling unit is not installed, that is, a case where the first substrate 410 is supplied to the first cluster 320 via the first conveyance chamber P1 without cooling the first substrate 410, will be described in detail below.

Meanwhile, when the vacuum degree of the second transfer chamber 321 is substantially the same as or equal to that of one of the first sputtering chambers 322 in which the sputtering process to form the first inorganic layer 431 is performed, the gate valve may be opened to move the first substrate 410 to the first sputtering chamber 322. After the first substrate 410 is loaded between a mask (e.g., a previously mounted mask) and a substrate holder, the first substrate 410 may be aligned (e.g., precisely aligned) by using a mark on the first substrate 410 and an open mark on or open space in the mask by using an aligning instrument to which a vision unit is connected, and then the first substrate 410 and the mask may be connected to (e.g., adhered to) each other.

Meanwhile, a process gas for the sputtering process may be injected into the first sputtering chamber 322 to maintain a vacuum degree at 1E-1 to 1E-2 Pa (i.e., $1*10^{-1}$ to $1*10^{-2}$ Pa), and then a plasma discharge may be generated by applying a voltage to a cathode. In this case, film formation may be performed while the first substrate 410 or the cathode is in the first sputtering chamber 322.

During the above process, when a target thickness of the first inorganic layer 431 is achieved, the first substrate 410 or the cathode may be moved to a standby area to stop depositing material on the first substrate 410, and an injection of the process gas may be stopped to control conductance (i.e., flow) of a vacuum discharge system, and thus the vacuum degree of the first sputtering chamber 322 is maintained to be substantially the same as or equal to that of the second transfer chamber 321. In this case, the first substrate 410 and the mask may be separated from (e.g., detached from) each other and may be moved to a position from where the first substrate 410 may be ejected.

When the above process is completed, the first substrate 410 may be moved from the first sputtering chamber 322 to the second transfer chamber 321. The first substrate 410 may be conveyed from the second transfer chamber 321 to the first connection module M1.

For example, when the vacuum degrees of the second transfer chamber 321 and the second conveyance chamber P2 are substantially the same or equal, the first substrate 410 may be moved from the second transfer chamber 321 to the second conveyance chamber P2.

In this case, the first substrate 410 on which the light-emitting unit 420 is formed may be cooled by operating the second substrate cooling unit. For example, a second cooler may cool a second cooling plate by circulating a second refrigerant in or through the second cooling plate and may drop or reduce a temperature of the first substrate 410 by exchanging heat between the cooled second cooling plate, the first inorganic layer 431, the light-emitting unit 420, and the first substrate 410. The second cooler may operate when the first substrate 410 is loaded on the second cooling plate or may continuously operate irrespective of whether or not the first substrate 410 is loaded on the second cooling plate in the same or similar manner as that described above.

When the first substrate 410 is sufficiently cooled (e.g., completely cooled), after the vacuum degrees of the second conveyance chamber P2 and the first turn module chamber T1 are maintained or made to be substantially the same or equal, the first substrate 410 may be moved to and rotated (e.g., flipped) in the first turn module chamber T1 by, for example, 180 degrees, and thus a change in a deposition side of the first substrate 410 may be prevented (e.g., a change in an injection position of the second cluster 330 and the first monomer deposition chamber 332 may be prevented).

Meanwhile, when the operation of the first turn module chamber T1 is completed as described above and the vacuum degrees of the first turn module chamber T1 and the third conveyance chamber P3 are controlled to be substantially the same or equal, the first substrate 410 may be moved to the third conveyance chamber P3. The second substrate cooling unit of the third conveyance chamber P3 may cool (e.g., further cool) the first substrate 410. In this case, a method of cooling the first substrate 410 may be the same as or similar to that described above, and thus a detailed description thereof will be omitted here.

After the vacuum degrees of the third conveyance chamber P3 and the third transfer chamber 331 are maintained or made to be substantially the same or equal, a gate valve may be opened to move the first substrate 410 to the third transfer chamber 331. In this case, the first substrate 410 may be moved by using, for example, a robot.

When the above process is completed, when the vacuum degree of the third transfer chamber 331 is substantially the same as or equal to that of one of a plurality of first monomer deposition chambers 332 in which an organic deposition process of forming the first organic layer 432 is performed, the gate valve may be opened to move the first substrate 410 to one of the plurality of first monomer deposition chambers 332. In this case, after the first substrate 410 is loaded between a mask (e.g., a previously mounted mask) and a substrate holder, the first substrate 410 may be aligned (e.g., precisely aligned) by using a mark on the first substrate 410 and an open mark on or open space in the mask using an aligning instrument to which a vision unit is connected, and then the first substrate 410 and the mask may be connected to (e.g., adhered to) each other.

A process gas for the organic deposition process may be injected into the first monomer deposition chamber 332 in which the organic deposition process is performed to maintain a vacuum degree at, for example, 1E-1 to 1E-2 Pa (i.e., $1*10^{-1}$ to $1*10^{-2}$ Pa), and then a nozzle unit of a vaporizer containing an evaporated organic material may be opened. In this case, film formation and hardening are performed in the first monomer deposition chamber 332 while the first substrate 410 or a source unit is conveyed (e.g., moved relative to the other).

For example, as described above, when the first substrate 410 is loaded into the first monomer deposition chamber 332, a monomer and a photoinitiator that may be polymerized by applying UV rays or heat may be deposited by, for example, flash evaporation.

When the above process is completed, UV rays or heat may be applied to a surface of the first substrate 410 on which the monomer is deposited to harden the surface, and thus the monomer may be polymerized to form the first organic layer 432 including a polymer.

Meanwhile, during the above process, when a target thickness of the first organic layer 432 is achieved, the first substrate 410 or the source unit may be moved to a standby area to close the nozzle unit and to stop injecting the process gas, and then conductance (e.g., flow) of a vacuum discharge system may be controlled to maintain the vacuum degree of the first monomer deposition chamber 332 to be substantially the same as or equal to that of the third transfer chamber 331. In this case, the first substrate 410 and the mask may be detached from (e.g., separated from) each other and moved to a position from where the first substrate 410 may be ejected.

When the vacuum degrees of the first monomer deposition chamber 332 and the third transfer chamber 331 are substantially the same or equal, as described above, the first substrate 410 may be moved from the first monomer deposition chamber 332 to the third transfer chamber 331. The first substrate 410 may then be further moved from the third transfer chamber 331 to the second connection module M2.

For example, when the vacuum degrees of the third transfer chamber 331 and the fourth conveyance chamber P4 are substantially the same or equal, the first substrate 410 may be moved from the third transfer chamber 331 to the fourth conveyance chamber P4. When the first substrate 410 enters the fourth conveyance chamber P4, the third substrate cooling unit may cool the first substrate 410. In this case, a method in which the third substrate cooling unit cools the first substrate 410 may be the same as or similar to the method in which the second substrate cooling unit cools the first substrate 410 described above, and thus a detailed description thereof will be omitted here.

Meanwhile, when the vacuum degrees of the fourth conveyance chamber P4 and the second turn module chamber T2 are substantially the same or equal, the first substrate 410 may be moved to and rotated (e.g., flipped) in the second turn module chamber T2 by, for example, 180 degrees, and thus a change in a deposition side of the first substrate 410 may be prevented (e.g., a change in an injection position of the third cluster 340 and the first chemical vapor chamber 342 may be prevented).

When the above process is completed, when the vacuum degrees of the second turn module chamber T2 and the fifth conveyance chamber P5 are substantially the same or equal, the first substrate 410 may be moved to the fifth conveyance chamber P5. The third substrate cooling unit of the fifth conveyance chamber P5 may cool the first substrate 410. In this case, a method in which the third substrate cooling unit cools the first substrate 410 may be the same as or similar to the method in which the second substrate cooling unit cools the first substrate 410 described above, and thus a detailed description thereof will be omitted here.

After the vacuum degrees of the fifth conveyance chamber P5 and the third cluster 340 are maintained to be substantially the same or equal, the gate valve may be opened to move the first substrate 410 to the third cluster 340. For example, the first substrate 410 may be moved from the fourth conveyance chamber P4 to the fourth transfer chamber 341. In this case, the first substrate 410 may be moved by, for example, a robot.

As described above, when the vacuum degree of the fourth transfer chamber 341 is substantially the same as or equal to that of one of the plurality of first chemical vapor chambers 342 in which a PECVD process of forming the second inorganic layer 433 is performed by controlling a conductance (e.g., flow) of a vacuum discharge system using, for example, time spatial division, the gate valve may be opened to move the first substrate 410 to the first chemical vapor chamber 342. After the first substrate 410 is loaded between a mask (e.g., a previously mounted mask) and a substrate holder, the first substrate 410 may be aligned (e.g. precisely aligned) by using a mark on the first substrate 410 and an open mark on or an open space in the mask using an aligning instrument to which a vision unit is connected, and then the first substrate 410 and the mask may be connected to (e.g., adhered to) each other.

Thereafter, after a valve for controlling conductance, which may be connected to a high vacuum pump, may be completely closed, and a plasma generation unit may generate plasma by injecting argon (Ar), which is a discharge gas, to maintain or set a pressure of, for example, 1 Pa to 200 Pa and then a power level may be increased to, for example, 3 $W/cm^2$ to 5 $W/cm^2$.

In this case, a pressure of, for example, 1 to 200 Pa may be adjusted by supplying a reaction material, a reaction gas, and/or a conveyance gas using a plasma generation source. The reaction material may be injected into a plasma area to form a radical (e.g., a neutral plasma specie). For example, silicon nitride (e.g., SiN) generation gas may be used or $SiH_4/NH_3/N_2/H_2/Ar$ may be used. In the above-described environment, a film forming process may be performed. In this case, a film formation speed may be maintained or set at 200 nm/min or less, and a gas including, for example, $SiH_4$ (50-500 sccm)/$NH_3$(300-2000 sccm)/$N_2$(300-2000 sccm) may be supplied (e.g., continuously supplied).

Meanwhile, when a target thickness of the second inorganic layer 433 is achieved by performing the above process, plasma power may be dropped to 1 $W/cm_2$ through multiple steps including stopping supplying a gas contributing to the reaction. Thereafter, the first substrate 410 and the mask may be separated from (e.g., detached from) each other and moved to a position from where the first substrate 410 may be ejected. The valve for controlling conductance, which is installed in the high vacuum pump, may be opened (e.g., opened simultaneously as the first substrate 410 and the mask are separated) by time division spatial control, and then the vacuum degree of the first chemical vapor chamber 342 may be maintained to be substantially the same as or equal to that of the fourth transfer chamber 341. In this case, the first substrate 410 may be moved from the first chemical vapor chamber 342 to the fourth transfer chamber 341.

Meanwhile, when the above process is completed, the first substrate 410 may be moved from the fourth transfer chamber 341 to the third connection module M3. For example, when the vacuum degrees of the fourth vacuum chamber 341 and the sixth conveyance chamber P6 are substantially the same or equal, the first substrate 410 may be moved from the fourth vacuum chamber 341 to the sixth conveyance chamber P6. A temperature of the first substrate 410 may drop or be reduced due to the fourth substrate cooling unit included in the sixth conveyance chamber P6. In this case, a method in which the fourth substrate cooling unit cools the first substrate 410 may be the same as or similar to the method in which the second substrate cooling unit cools the first substrate 410 described above, and thus a detailed description thereof will be omitted here.

When the vacuum degrees of the sixth conveyance chamber P6 and the third turn module chamber T3 are substantially the same or equal, the first substrate 410 may be moved to and rotated (e.g., flipped) in the third turn module chamber T3 by, for example, 180 degrees, and thus a change in a deposition side of the first substrate 410 may be prevented (e.g., a change in an injection position of the fourth cluster 360 and/or that second monomer deposition chamber 362 may be prevented).

In this case, when the vacuum degrees of the third turn module chamber T3 and the seventh conveyance chamber P7 are substantially the same or equal, the first substrate 410 may be moved to the seventh conveyance chamber P7. For example, when the first substrate 410 is loaded into the seventh conveyance chamber P7, a temperature of the first substrate 410 may drop or be reduced due to use of the fourth substrate cooling unit. In this case, a method of operating the fourth substrate cooling unit of the seventh conveyance chamber P7 may be the same as or similar to that described above, and thus a detailed description thereof will be omitted here.

After the vacuum degrees of the seventh conveyance chamber P7 and the sixth transfer chamber 361 are maintained or set to be substantially the same or equal, the gate valve may be opened to move the first convey substrate 410 to the sixth transfer chamber 361. In this case, the first substrate 410 may be moved by, for example, a robot.

Meanwhile, when the vacuum degree of the sixth transfer chamber 361 is substantially the same as or equal to that of one of a plurality of second monomer deposition chambers 362 in which the organic deposition process forming the second organic layer 434 is performed, the gate valve may be opened to move the first substrate 410 on which the light-emitting unit 420 is formed to the second monomer deposition chamber 362. In this case, the method of forming the second organic layer 434 may be similar to the method of forming the first organic layer 432, and thus a detailed description thereof will be omitted here.

When a target thickness of the second organic layer 434 is achieved, the first substrate 410 or the source unit may be moved to a standby area to close the nozzle unit and stop injecting a process gas, and then the vacuum degrees of the second monomer deposition chamber 362 may be maintained or set to be substantially the same as or equal to the sixth transfer chamber 361 by controlling conductance of a vacuum discharge system. In this case, the first substrate 410 and the mask may be separated from (e.g., detached from) each other and moved to a position from where the first substrate 410 may be ejected.

Meanwhile, the first substrate 410 may be moved from the second monomer deposition chamber 362 to the sixth transfer chamber 361 as described above, and then may be moved to the fourth connection module M4.

For example, when the vacuum degrees of the sixth transfer chamber 361 and the eighth conveyance chamber P8 are substantially the same or equal, the first substrate 410 may be moved from the sixth transfer chamber 361 to the eighth conveyance chamber P8. In this case, the fifth substrate cooling unit of the eighth conveyance chamber P8 may cool the first substrate 410. In this case, a method in which the fifth substrate cooling unit cools the first substrate 410 may be the same as or similar to the method in which the second substrate cooling unit cools the first substrate 410 described above, and thus a detailed description thereof will be omitted here.

When the vacuum degrees of the eighth conveyance chamber P8 and the fourth turn module chamber T4 are substantially the same or equal, the first substrate 410 may be moved to and rotated (e.g., flipped) in the fourth turn module chamber T4 by, for example, 180 degrees, and thus a change in a deposition side of the first substrate 410 may be prevented (e.g., a change in an injection position of the fifth cluster 370 and the second chemical vapor chamber 372 may be prevented).

When the above process is completed, when the vacuum degrees of the fourth turn module chamber T4 and the ninth conveyance chamber P9 are substantially the same or equal, the first substrate 410 may be moved to the ninth conveyance chamber P9. In this case, the fifth substrate cooling unit of the ninth conveyance chamber P9 may cool the first substrate 410. In this case, a method in which the fifth substrate cooling unit cools the first substrate 410 may be the same as or similar to that described above, and thus a detailed description thereof will be omitted here.

When the first substrate 410 is sufficiently cooled (e.g., completely cooled), after the vacuum degrees of the ninth conveyance chamber P9 and the seventh transfer chamber 371 are maintained or set to be substantially the same or equal, the gate valve may be opened to move the first convey substrate 410 to the seventh transfer chamber 371. In this case, the first substrate 410 may be moved by, for example, a robot.

When the above process is completed, when a vacuum degree of the seventh transfer chamber 371 is substantially the same as or equal to that of one of the plurality of second chemical vapor chambers 372, in which a PECVD process for forming the third inorganic layer 435 is performed, by controlling conductance of a vacuum discharge system using time spatial division, the gate valve may be opened to move the first substrate 410 to the second chemical vapor chamber 372. In this case, the method of forming the third inorganic layer 435 after aligning the first substrate 410 and the mask may be similar to the method of forming the second inorganic layer 233 described above, and thus a detailed description thereof will be omitted here.

Meanwhile, when the process is completed, that is, when a target thickness of the third inorganic layer 435 is achieved, the first substrate 410 on which the light-emitting unit 420 is formed and the mask may be separated from (e.g., detached from) each other and moved to a position from where the first substrate 410 may be ejected. The valve for controlling conductance, which is installed in the high vacuum pump and controlled by time spatial control, may be opened (e.g., may be opened concurrently or simultaneously as the first substrate 410 and the mask are separated), and then a vacuum degree of the second chemical vapor chamber 372 may be maintained or set to be substantially the same as or equal to that of the seventh transfer chamber 371.

When the above process is completed, the display apparatus 400 may be conveyed from the second chemical vapor chamber 372 to the seventh transfer chamber 371. When the vacuum degrees of the seventh transfer chamber 371 and the tenth conveyance chamber P10 are substantially the same or equal, the display apparatus 400 may be moved from the seventh transfer chamber 371 to the tenth conveyance chamber P10.

Meanwhile, when the above process is completed, the display apparatus 400 may be conveyed from the tenth conveyance chamber P10 to the fifth turn module chamber T5, rotated by, for example, 180 degrees, and aligned in the fifth turn module chamber T5, and then conveyed to the eleventh conveyance chamber P11.

In this case, a user may complete the process by moving the display apparatus 400 ejected from the eleventh conveyance chamber P11 to the outside. For example, the display apparatus 400 in the eleventh conveyance chamber P11 may be taken out by, for example, a robot.

Therefore, the thin film encapsulation manufacturing apparatus 300 may control a thickness of each of layers when a stacked, multilayer thin film is formed including an organic layer and an inorganic layer and may form an in-line cluster and may maintain vacuum degrees of various thin film process equipment to be substantially the same or equal using a time spatial division vacuum control of a PECVD process. The thin film encapsulation manufacturing apparatus 300 may form the in-line cluster, thereby performing sputtering, organic deposition, and PECVD in an in-line manner.

The film encapsulation manufacturing apparatus 300 may drop or reduce the temperature of the first substrate 410 before each process is performed, and thus, an effect or factor (for example, an increase in takt time) caused by a temperature rise or increase of the first substrate 410 due to each process may be prevented or reduced, thereby ensuring prompt thin film encapsulation.

Furthermore, the thin film encapsulation manufacturing apparatus 300 may drop or reduce the temperature of the first substrate 410 before films are formed including, for example, the first organic layer 432, the second inorganic layer 433, the second organic layer 434, and the third inorganic layer 435, thereby improving quality of the first organic layer 432, the second inorganic layer 433, the second organic layer 434, and the third inorganic layer 435.

Figure 8:
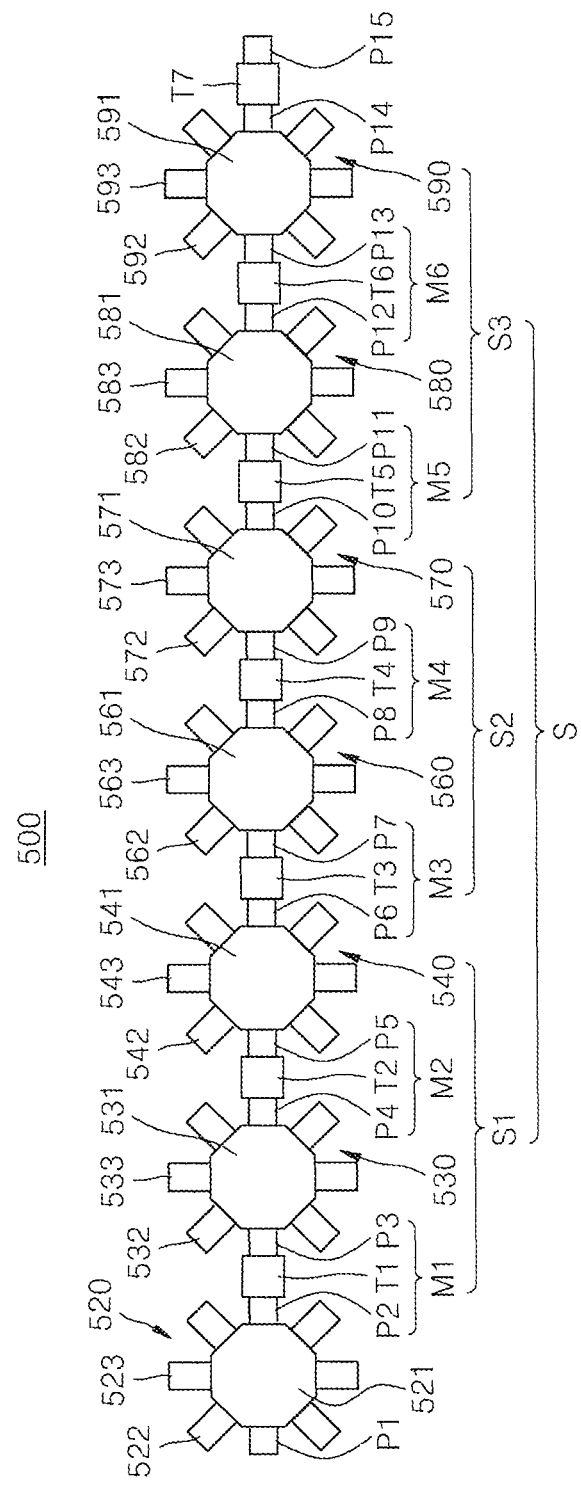
FIG. 8 is a conceptual diagram of a thin film encapsulation manufacturing apparatus according to another embodiment of the present invention.
Figure 9:
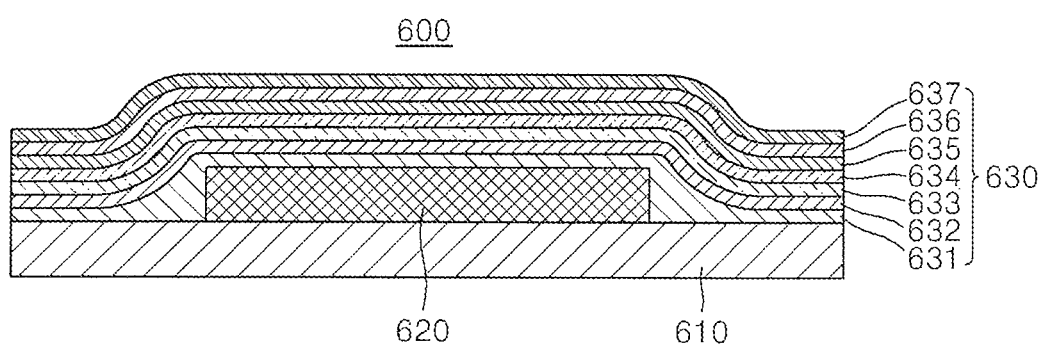
FIG. 9 is a cross-sectional view of a display apparatus manufactured using the thin film encapsulation manufacturing apparatus shown in FIG. 8.

FIG. 8 is a conceptual diagram of a thin film encapsulation manufacturing apparatus 500 according to another embodiment of the present invention. FIG. 9 is a cross-sectional view of a display apparatus 600 manufactured using the thin film encapsulation manufacturing apparatus 500 shown in FIG. 8.

Referring to FIGS. 8 and 9, the thin film encapsulation manufacturing apparatus 500 may include a loading cluster, the first conveyance chamber P1, a first cluster 520, the first connection module M1, a second cluster 530, the second connection module M2, and a third cluster 540. In this case, the first connection module M1, the second cluster 530, the second connection module M2, and the third cluster 540 may be installed (e.g., sequentially installed). In this case, the first connection module M1, the second cluster 530, the second connection module M2, and the third cluster 540 may form the single organic/inorganic layer formation module S. A plurality of organic/inorganic layer formation modules S may be formed, and may include the first organic/inorganic layer formation module S1 connected to the first cluster 520 and the second organic/inorganic layer formation module S2 connected to the first organic/inorganic layer formation module S1. The plurality of organic/inorganic layer formation modules S may include a third organic/inorganic layer formation module S3 connected to the second organic/inorganic layer formation module S2.

The first organic/inorganic layer formation module S1, the second organic/inorganic layer formation module S2, and the third organic/inorganic layer formation module S3 may form (e.g., sequentially form) a first organic layer 632 and a second inorganic layer 633 alternately. As such, the first organic layer 632, the second inorganic layer 633, a second organic layer 634, a third inorganic layer 635, a third organic layer 636, and a fourth inorganic layer 637 that will be further described later may be formed.

The loading cluster, the first conveyance chamber P1 of the first organic/inorganic layer formation module S1, the first cluster 520, the first connection module M1, the second cluster 530, the second connection module M2, and the third cluster 540 of the thin film encapsulation manufacturing apparatus 500 may be connected (e.g., sequentially connected) to each other. A first connection module of the second organic/inorganic layer formation module S2, a second cluster, a second connection module, and a third cluster may be connected (e.g., sequentially connected) to the third cluster 540. However, to avoid confusion of description, the first connection module of the second organic/inorganic layer formation module S2, the second cluster, the second connection module, and the third cluster that are connected (e.g., sequentially connected) to the third cluster 540 are respectively renamed as the third connection module M3, the fourth cluster 560, the fourth connection module M4, and the fifth cluster 570 and will be described in further detail below.

To avoid confusion of description, a first connection module, a second cluster, a second connection module, and a third cluster of the third organic/inorganic layer formation module S3 that are connected (e.g., sequentially connected) to the fifth cluster 570 are respectively renamed as the fifth connection module M5, the sixth cluster 580, the sixth connection module M6, and the seventh cluster 590 and will be described in further detail below.

For example, the thin film encapsulation manufacturing apparatus 500 may include the loading cluster, the first conveyance chamber P1, the first cluster 520, the first connection module M1, the conveyance chamber P2, the first turn module chamber T1, the third conveyance chamber P3, the second cluster 530, the second connection module M2, the fourth conveyance chamber P4, the second turn module chamber T2, the fifth conveyance chamber P5, the third cluster 540, the third connection module M3, the sixth conveyance chamber P6, the third turn module chamber T3, the seventh conveyance chamber P7, the fourth cluster 560, the fourth connection module M4, the eighth conveyance chamber P8, the fourth turn module chamber T4, the ninth conveyance chamber P9, the fifth cluster 570, the tenth conveyance chamber P10, the fifth turn module chamber T5, the eleventh conveyance chamber P11, the sixth cluster 580, a sixth connection module M6, a twelfth conveyance chamber P12, a sixth turn module chamber T6, a thirteenth conveyance chamber P13, the seventh cluster 590, a fourteenth conveyance chamber P14, the seventh turn module chamber T7, a fifteenth conveyance chamber P15, and an unloading cluster.

In this case, the first conveyance chamber P1 may include a first substrate cooling unit. The first substrate cooling unit may cool a first substrate 610 conveyed to the first cluster 520, for example, in a non-contact manner. In this case, the first substrate cooling unit may be the same as or similar to that described above, and thus a detailed description thereof will be omitted here. For convenience of description, an example embodiment in which the first substrate cooling unit is not included in the first conveyance chamber P1 will be described in detail below.

Meanwhile, the first connection module M1 and the second connection module M2 may be formed in a similar manner to the first connection module M1 and the second connection module M2 described with reference to FIGS. 1 and 2. For example, the first connection module M1 may include the second conveyance chamber P2, the first turn module chamber T1, and the third conveyance chamber P3. The second connection module M2 may include the fourth conveyance chamber P4, the second turn module chamber T2, and the fifth conveyance chamber P5.

The first connection module M1 may include a second substrate cooling unit that cools the first substrate 610, for example, in a non-contact manner. In this case, the second connection module M2 may include a third substrate cooling unit. An example embodiment in which the second connection module M2 does not include the third substrate cooling unit will be described in further detail below.

The second substrate cooling unit may be installed in at least one of the conveyance chamber P2, the first turn module chamber T1, and the third conveyance chamber P3. For convenience of description, an example embodiment in which the second substrate cooling unit is installed in each of the conveyance chambers P2 and P3 will be described in further detail below.

As described above, the second substrate cooling unit may include a second cooling plate and a second cooler. The second cooling plate and the second cooler may be the same as or similar to those described with reference to FIGS. 1 and 2, and thus detailed descriptions thereof will be omitted here.

Meanwhile, the third connection module M3 and the fifth connection module M5 may be formed in the same or similar manner as the first connection module M1, and the fourth connection module M4 and the sixth connection module M6 may be formed in the same or similar manner as the second connection module M2.

For example, the third connection module M3 may include the sixth conveyance chamber P6, the third turn module chamber T3, and the seventh conveyance chamber P7. The fourth connection module M4 may include the eighth conveyance chamber P8, the fourth turn module chamber T4, and the ninth conveyance chamber P9. The fifth connection module M5 may include the tenth conveyance chamber P10, the fifth turn module chamber T5, and the eleventh conveyance chamber P11. The sixth connection module M6 may include the twelfth conveyance chamber P12, the sixth turn module chamber T6, and the thirteenth conveyance chamber P13.

The first connection module M1 may include a fourth substrate cooling unit. The fifth connection module M5 may include a sixth substrate cooling unit. In this case, the fourth substrate cooling unit and the sixth substrate cooling unit may be formed in the same or similar manner as the second substrate cooling unit, and thus detailed descriptions thereof will be omitted here.

Meanwhile, the first through fifteenth conveyance chambers P1 through P15 may be formed in the same or similar manner as the first through fourth conveyance chambers P1 through P4 described above with reference to FIGS. 1 and 2, and the first substrate 610 on which an light-emitting unit 620 is formed may be conveyed in the same manner or in a similar manner, and thus, detailed descriptions thereof will be omitted here.

The first through seventh turn module chambers T1 through T7 may be formed in the same manner or in a similar manner to the first and second turn module chambers T1 and T2 described above with reference to FIGS. 1 and 2, and the first substrate 610 on which the light-emitting unit 620 is formed may be conveyed in the same manner or in a similar manner, and thus, detailed descriptions thereof will be omitted here.

Meanwhile, the loading cluster and the unloading cluster may be formed in the same or similar manner as described above with reference to FIGS. 1 and 2, and thus, detailed descriptions thereof will be omitted. The loading cluster and the unloading cluster may be included or may not be included in the thin film encapsulation manufacturing apparatus 500, and thus, for convenience of description, an example embodiment in which the loading cluster and the unloading cluster are not included will be described in further detail below.

The first cluster 520 may include a second transfer chamber 521, a first sputtering chamber 522, and a first mask stock chamber 523. The first cluster 520 may be formed in the same or similar manner as that described above with reference to FIGS. 1 and 2, and thus, a detailed description thereof will be omitted here.

The second cluster 530 may include a third transfer chamber 531, a first monomer deposition chamber 532, and a second mask stock chamber 533. In this case, the second cluster 530 may be formed in the same or similar manner as that described above with reference to FIGS. 1 and 2, and thus, a detailed description thereof will be omitted here.

The third cluster 540 may include a fourth transfer chamber 541, a first chemical vapor chamber 542, and a third mask stock chamber 543. In this case, the third cluster 540 may be formed in the same or similar manner as that described above with reference to FIGS. 1 and 2, and thus, a detailed description thereof will be omitted here. For convenience of description, an example embodiment in which a second inorganic layer 633 is formed in the first chemical vapor chamber 542 using a PECVD process will be described in further detail below.

Meanwhile, the fourth cluster 560 may include a sixth transfer chamber 561, a second monomer deposition chamber 562, and a fourth mask stock chamber 563. In this case, the fourth cluster 560 may form a second organic layer 634 on the second inorganic layer 633. For example, the fourth cluster 560 may be formed in a similar manner to the second cluster 530, and the second organic layer 634 may be formed in the same or similar manner as the first organic layer 632, and thus, detailed descriptions thereof will be omitted here.

The fifth cluster 570 may include a seventh transfer chamber 571, a second chemical vapor chamber 572, and a fifth mask stock chamber 573. In this case, the fifth cluster 570 may form a third inorganic layer 635 on the second organic layer 634. For example, the fifth cluster 570 may be formed in a similar manner to the third cluster 540, and the third inorganic layer 635 may be formed in the same or similar manner as the second organic layer 633, and thus, detailed descriptions thereof will be omitted here.

Meanwhile, the sixth cluster 580 may include an eighth transfer chamber 581, a third monomer deposition chamber 582, and a sixth mask stock chamber 583. In this case, the sixth cluster 580 may form a third organic layer 636 on the third inorganic layer 635. For example, the sixth cluster 580 may be formed in a similar manner to the second cluster 530, and the third organic layer 636 may be formed in the same or similar manner as the first organic layer 632, and thus, detailed descriptions thereof will be omitted here.

The seventh cluster 590 may include a ninth transfer chamber 591, a third chemical vapor chamber 592, and a seventh mask stock chamber 593. In this case, the seventh cluster 590 may form a fourth inorganic layer 637 on the third organic layer 636. For example, the seventh cluster 590 may be formed in a similar manner to the third cluster 540, and the fourth inorganic layer 637 may be formed in the same or similar manner as the second inorganic layer 633, and thus, detailed descriptions thereof will be omitted here.

Meanwhile, a method of performing a thin film encapsulation process using the thin film encapsulation manufacturing apparatus 500 and a structure of the first substrate 610 will be described in further detail below.

The display apparatus 600 may include the first substrate 610 and the light-emitting unit 620 formed thereon. In this case, the first substrate 610 and the light-emitting unit 620 are respectively the same as or similar to the first substrate 210 and the light-emitting unit 220 described above with reference to FIGS. 1 and 2, and thus, detailed descriptions thereof will be omitted here.

Meanwhile, after the first substrate 610 on which the light-emitting unit 620 is formed is prepared, an encapsulation unit 630 may be formed when the first substrate 610 enters the thin film encapsulation manufacturing apparatus 500. In this case, the encapsulation unit 630 may include at least one structure (e.g., sandwich or layered structure) in which at least one organic layer is formed between (e.g., inserted between) at least two inorganic layers. The encapsulation unit 630 may include at least one structure (e.g., sandwich or layered structure) in which at least one inorganic layer is formed between (e.g., inserted between) at least two organic layers.

For example, the encapsulation unit 630 may be formed by stacking (e.g., sequentially stacking) a first inorganic layer 631, the first organic layer 632, the second inorganic layer 633, the second organic layer 634, the third inorganic layer 635, the third organic layer 636, and the fourth inorganic layer 637 as described above.

For example, the first through third organic layers 632, 634, and 636 may be formed of a polymer, and may be single layers or stacked layers that are formed of one of polyethylene terephthalate, a polyimide, a polycarbonate, an epoxy, polyethylene, and polyacrylate. The first through third organic layers 632, 634, and 636 may be formed of, for example, polyacrylate, and may include a polymerized monomer composition including a diacrylate monomer and a triacrylate monomer. The monomer composition may further include a monoacrylate monomer. A suitable photoinitiator, such as a thermoplastic polyolefin (TPO), may be further included in the monomer composition, but is not limited thereto.

The first through fourth inorganic layers 631, 633, 635, and 637 may be single layers or stacked layers including, for example, a metal oxide or a metal nitride. For example, the first through fourth inorganic layers 631, 633, 635, and 637 may include one of silicon nitride (e.g., $SiN_x$), aluminum oxide (e.g., $Al_2O_3$), silicon oxide (e.g., $SiO_2$), and titanium oxide (e.g., $TiO_2$). In this case, the fourth inorganic layer 637 may be formed to prevent or reduce penetration of moisture into the light-emitting unit 620.

Meanwhile, a halogenized metal layer including, for example, lithium fluoride (e.g., LiF), may be further included between the light-emitting unit 620 and the first inorganic layer 631. The halogenized metal layer may prevent or reduce damage to the light-emitting unit 620 when the first inorganic layer 631 is formed using a sputtering process.

The first organic layer 632 may be smaller than (e.g., a surface area of the first organic layer 632 may be smaller than that of) the second inorganic layer 633, and the second organic layer 634 may also be smaller than (e.g., a surface area of the second organic layer 634 may be smaller than that of) the third inorganic layer 635. The third organic layer 636 may also be smaller than (e.g., a surface area of the third organic layer 636 may also be smaller than that of) the fourth inorganic layer 637.

In this case, the first organic layer 632 may be covered (e.g., completely covered) by the second inorganic layer 633, and the second organic layer 634 may also be covered (e.g., completely covered) by the third inorganic layer 635. The third organic layer 636 may also be covered (e.g., completely covered) by the fourth inorganic layer 637.

A method of forming the encapsulation unit 630 as described above may include maintaining a vacuum degree of the thin film encapsulation apparatus 500 at, for example, 5E-4 Pa or less (i.e., $5*10^{-4}$ Pa or less), moving masks from the first through fifth mask stock chambers 523, 533, 543, 563, and 573 into the first sputtering chamber 522, the first monomer deposition chamber 532, the first chemical vapor chamber 542, the second monomer deposition chamber 562, and the second chemical vapor chamber 572, respectively, using, for example, a robot arm, and mounting the masks in each respective chamber.

When the above process is completed, the first inorganic layer 631, the first organic layer 632, the second inorganic layer 633, the second organic layer 634, and the third inorganic layer 635 may be formed (e.g., sequentially formed) on the light-emitting unit 620. In this case, a method of forming the first inorganic layer 631, the first organic layer 632, the second inorganic layer 633, the second organic layer 634, and the third inorganic layer 635 may be the same as or similar to those described above with reference to FIGS. 6 and 7, and thus, a detailed description thereof will be omitted here.

In this case, as described above, a halogenized metal layer including, for example, lithium fluoride (e.g., LiF) may be formed on the light-emitting unit 620 so as to prevent or reduce damage to the light-emitting unit 620 during a sputtering process before the first inorganic layer 631 is formed, or a hologenized metal layer including, for example, lithium fluoride (e.g., LiF) may not be formed. For convenience of description, an example embodiment in which the halogenized metal layer is not formed on the light-emitting unit 620 but in which the first inorganic layer 631 is formed will be described in detail below.

When the first substrate cooling unit is installed in the first conveyance chamber P1, the first substrate 610 that enters the first conveyance chamber P1 may be cooled by the first substrate cooling unit, for example, in a non-contact manner. For convenience of description, an example embodiment in which the first substrate cooling unit is not installed, that is, a case where the first substrate 610 is supplied to the first cluster 520 via the first conveyance chamber P1 without cooling the first substrate 610, will be described in detail below.

Meanwhile, after the first inorganic layer 631 is formed, a temperature of the first substrate 610 conveyed to the first connection module M1 may drop or be reduced due to the second substrate cooling unit, and may then be conveyed to the second cluster 530, and thus the first organic layer 632 may be formed. For example, the temperature of the first substrate 610 that passes through the second conveyance chamber P2 and the third conveyance chamber P3 may drop or be reduced according to an operation of the second substrate cooling unit that is installed in each of the second conveyance chamber P2 and the third conveyance chamber P3. In this case, a method of operating the second substrate cooling unit may be the same as or similar to that described above, and thus a detailed description thereof will be omitted here.

After the third cluster 540 forms the second inorganic layer 633 on the first organic layer 632, the first substrate 610 may be moved from the third cluster 540 to the third connection module M3. In this case, the first substrate 610 may be supplied to the fourth cluster 560 when the temperature of the first substrate 610 drops or is reduced due to the fourth substrate cooling unit included in the third connection module M3. A method of operating the fourth substrate cooling unit may be the same as or similar to the method of operating the second substrate cooling unit described above, and thus a detailed description thereof will be omitted here.

The second organic layer 634 may be formed on the first substrate 610 conveyed as described above to the fourth cluster 560, and then moved to the fifth cluster 570 via the fourth connection module M4, and thus the third inorganic layer 635 may be formed.

When the above process is completed, the first substrate 610 may be moved from the fifth cluster 570 to the sixth cluster 580 via the fifth connection module M5. For example, the first substrate 610 may enter the sixth cluster 580 from the fifth cluster 570 via the tenth conveyance chamber P10, the fifth turn module chamber T5, and the eleventh conveyance chamber P11. For example, when the first substrate 610 passes through the fifth connection module M5, the first substrate 610 may be cooled by the sixth substrate cooling unit that is installed in each of the tenth conveyance chamber P10 and the eleventh conveyance chamber P11, and may be supplied to the sixth cluster 580. In this case, a method of operating the sixth substrate cooling unit may be the same as or similar to the method of operating the second substrate cooling unit as described above, and thus a detailed description thereof will be omitted here.

The third organic layer 636 may be formed on the third inorganic layer 635 in the sixth cluster 580 using an organic deposition process. In this case, a method of operating the sixth cluster 580 may be the same as or similar to the method of operating the second cluster 530 and the fourth cluster 560 described above, and thus a detailed description thereof will be omitted here.

When the above process is completed, the first substrate 610 may be moved from the sixth cluster 580 to the seventh cluster 590 via the twelfth conveyance chamber P12, the sixth turn module chamber T6, and the thirteenth conveyance chamber P13.

In this case, the fourth inorganic layer 637 may be formed on the third organic layer 636 in the seventh cluster 590. For example, the fourth inorganic layer 637 may be formed using, for example, a PECVD process in the seventh cluster 590. In this case, the seventh cluster 590 may operate in a similar manner to the third cluster 540 and the fifth cluster 570, and thus, a detailed description thereof will be omitted here.

After the fourth inorganic layer 637 is formed as described above, the first substrate 610 on which the light-emitting unit 620 is formed may be drawn out from (e.g., removed from) the seventh cluster 590 to the outside via the fourteenth conveyance chamber P14, the seventh turn module chamber T7, and the fifteenth conveyance chamber P15.

Meanwhile, the encapsulation unit 630 formed as described above is not limited thereto, and may be formed by alternately forming the first organic layer 632 and the second inorganic layer 633 on the first inorganic layer 631.

Therefore, the thin film encapsulation manufacturing apparatus 500 may control a thickness of each of layers when a stacked, multilayer thin film is formed including an organic layer and an inorganic layer, may include an in-line type cluster arrangement, and may maintain vacuum degrees of various thin film process equipment to be substantially the same or equal using time spatial division vacuum control of PECVD. The thin film encapsulation manufacturing apparatus 500 may form the in-line type cluster arrangement, thereby performing sputtering, organic deposition, and PECVD in an in-line manner.

The film encapsulation manufacturing apparatus 500 may drop or reduce the temperature of the first substrate 610 before each process is performed, and thus an effect (e.g. a factor) caused by a temperature rise or increase of the first substrate 610 due to each process may be prevented or reduced, thereby ensuring prompt thin film encapsulation.

Furthermore, the thin film encapsulation manufacturing apparatus 500 may drop or reduce the temperature of the first substrate 610 before films are formed including, for example, the first organic layer 632, the second organic layer 634, and the third organic layer 636, thereby improving quality of the first organic layer 632, the second organic layer 634, and the third organic layer 636.

As described above, according to the one or more of the above embodiments of the present invention, a thickness of each of layers may be controlled when a stacked, multilayer thin film is formed including an organic layer and an inorganic layer. An in-line type cluster arrangement may also be formed and may maintain vacuum degrees of various thin film process equipment to be substantially the same or equal by using time spatial division vacuum control of PECVD. The in-line type cluster may be formed, thereby performing sputtering, organic deposition, and PECVD in an in-line manner.

It should be understood that the example embodiments described herein should be considered in a descriptive sense only and not for purposes of limitation. Descriptions of features and/or aspects within each embodiment should typically be considered as available for other similar features and/or aspects in other embodiments.

While one or more example embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A method of manufacturing a display apparatus, the method comprising:
    forming a first inorganic layer on a first substrate, on which an emission unit is formed, by a sputtering process;
    cooling the first substrate on which the first inorganic layer is formed by absorbing radiation emitted therefrom in a non-contact manner;
    forming a first organic layer on the first inorganic layer by an organic deposition process; and
    forming a second inorganic layer on the first organic layer.

2. The method of claim 1, wherein the second inorganic layer is formed after flipping the first substrate.

3. The method of claim 1, further comprising cooling the first substrate on which the first organic layer is formed in the non-contact manner.

4. The method of claim 1, wherein the first inorganic layer, the first organic layer, and the second inorganic layer are respectively formed in a plurality of first process chambers of a first cluster, a plurality of second process chambers of a second cluster, and a plurality of third process chambers of a third cluster.

5. The method of claim 4, wherein a sequence of the plurality of first process chambers of the first cluster, the plurality of second process chambers of the second cluster, and the plurality of third process chambers of the third cluster is determined, and the first inorganic layer, the first organic layer, and the second inorganic layer are respectively formed in a first one of the plurality of first process chambers of the first cluster, a first one of the plurality of second process chambers of the second cluster, and a first one of the plurality of third process chambers of the third cluster according to the determined sequence.

6. The method of claim 4,
    wherein the first cluster and the second cluster are coupled by a first connection module that is configured to convey the first substrate from the first cluster to the second cluster, and
    when the first substrate is conveyed, internal pressures of the first cluster and the first connection module or of the first connection module and the second cluster are substantially the same.

7. The method of claim 4,
    wherein the second cluster and the third cluster are coupled by a second connection module that is configured to convey the first substrate from the second cluster to the third cluster, and
    when the first substrate is conveyed, internal pressures of the second cluster and the second connection module or of the second connection module and the third cluster are substantially the same.

8. The method of claim 1, wherein the cooling of the first substrate, the forming of the first organic layer, and the forming of the second inorganic layer are performed sequentially so that the first organic layer and the second inorganic layer are alternately stacked on the first inorganic layer.

9. The method of claim 1, wherein the first inorganic layer and the first organic layer are formed by downward deposition, and the second inorganic layer is formed by upward deposition.

10. The method of claim 1, wherein, before the forming of the first inorganic layer, the first substrate with the first organic layer formed thereon is received from the outside via a loading cluster.

11. The method of claim 1,
    wherein the first substrate is cooled by a second substrate cooling unit that is spaced from the first substrate, and the second substrate cooling unit comprises:
        a second cooling plate spaced from the first substrate; and
        a second cooler coupled to and cooling the second cooling plate.

12. The method of claim 11, wherein a second refrigerant passage, through which a second refrigerant circulated by the second cooler flows, is formed in the second cooling plate.

13. The method of claim 1, further comprising cooling the first substrate on which the first organic layer is formed in the non-contact manner.

14. The method of claim 1, wherein the second inorganic layer is formed by a chemical vapor deposition (CVD) process or a plasma enhanced chemical vapor deposition (PECVD) process.

15. The method of claim 1, further comprising cooling the first substrate before forming the first inorganic layer.

16. The method of claim 6, wherein the first connection module comprises a second substrate cooling unit cooling the first substrate in a non-contact manner, and
    the first substrate is cooled as it is conveyed from the first cluster to the second cluster.

17. The method of claim 4, wherein, prior to forming each of the first inorganic layer, the first organic layer, and the second inorganic layer, a mask is moved from each of a first mask stock chamber, a second mask stock chamber, and a third mask stock chamber into one of the plurality of the first process chambers of the first cluster, one of the plurality of the second process chambers of the second cluster, and one of the plurality of the third process chambers of the third cluster, respectively, and
    the first substrate is moved to be between a substrate holder and the mask in each of the one first process chamber, the one second process chamber, and the one third process chamber, and
    the first inorganic layer, the first organic layer, and the second inorganic layer are formed on the first substrate in the one first process chamber, the one second process chamber, and the one third process chamber, respectively.

18. The method of claim 17, wherein the first substrate is aligned by an aligning instrument,
the aligning instrument comprises:
a mark on the first substrate;
an open space in the mask; and
a vision unit, and
aligning the first substrate comprises adjusting the first substrate or the mask until the mark on the first substrate is visible through the open space on the mask.

* * * * *